US009083437B2

(12) United States Patent
Yeo et al.

(10) Patent No.: US 9,083,437 B2
(45) Date of Patent: Jul. 14, 2015

(54) FRONT-END TRANSCEIVER

(75) Inventors: Kiat Seng Yeo, Singapore (SG); Jian Guo Ma, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 597 days.

(21) Appl. No.: 13/391,893

(22) PCT Filed: Aug. 24, 2010

(86) PCT No.: PCT/SG2010/000307
§ 371 (c)(1),
(2), (4) Date: Jul. 9, 2012

(87) PCT Pub. No.: WO2011/025456
PCT Pub. Date: Mar. 3, 2011

(65) Prior Publication Data
US 2012/0274367 A1    Nov. 1, 2012

Related U.S. Application Data

(60) Provisional application No. 61/236,278, filed on Aug. 24, 2009.

(51) Int. Cl.
*H04B 1/38* (2006.01)
*H04B 1/28* (2006.01)
(Continued)

(52) U.S. Cl.
CPC ............... *H04B 1/28* (2013.01); *H03D 7/163* (2013.01); *H03D 7/166* (2013.01); *H04B 15/04* (2013.01); *H04B 2215/064* (2013.01)

(58) Field of Classification Search
CPC ...... H04B 1/0039; H04B 1/0092; H04B 1/30; H04B 1/109; H04B 1/408; H04B 15/04; H04B 17/001; H04B 1/28; H04B 2215/064; H03F 1/3205; H03F 1/342; H03F 2200/99
USPC .......................................................... 455/73
See application file for complete search history.

(56) References Cited

U.S. PATENT DOCUMENTS 4,551,856 A    11/1985    Victor et al.
6,118,984 A *  9/2000    Yu-Hong .................. 455/76
(Continued)

FOREIGN PATENT DOCUMENTS

CN    101505169    8/2009
WO    WO2008060528    5/2008
WO    WO2009006625    1/2009

OTHER PUBLICATIONS

Emami, et al., A Highly Integrated 60GHz CMOS Front-End Receiver, IEEE International Solid-State Circuits Conference 190 (IEEE 2007).
(Continued)

*Primary Examiner* — Ajibola Akinyemi
(74) *Attorney, Agent, or Firm* — K. David Crockett, Esq.; Niky Economy Syrengelas, Esq.; Crockett & Crockett, PC

(57) ABSTRACT

In an embodiment, a front-end transceiver may be provided. The front-end transceiver may include a receiver path, including a first receiver frequency converter configured to convert a received signal with a receiver frequency into a first receiver intermediate signal with a first receiver intermediate frequency; and a receiver direct conversion stage coupled to the first receiver frequency converter so as to receive the first receiver intermediate signal. The front-end transceiver may further include an oscillator signal generator respectively coupled to the first receiver frequency converter and to the receiver direct conversion stage so as to provide a first oscillator signal with a first oscillator frequency to the first receiver frequency converter and a first stabilizing signal with a first stabilizing frequency to the receiver direct conversion stage; wherein the oscillator signal generator may be configured so that the first oscillator frequency of the first oscillator signal may be selected such that any integer multiple of the first oscillator frequency of the first oscillator signal may be different from any integer multiple of the receiver frequency of the received signal. The front-end transceiver may also include a transmitter path.

19 Claims, 10 Drawing Sheets

(51) Int. Cl.
*H03D 7/16* (2006.01)
*H04B 15/04* (2006.01)

(56) References Cited

U.S. PATENT DOCUMENTS

2007/0111697 A1  5/2007  Bellantoni
2008/0014894 A1* 1/2008  Manku et al. ............ 455/318

OTHER PUBLICATIONS

Huang, et al., A 24/60GHz Dual-Band Millimeter-Wave On-Chip Monopole Antenna Fabricated with a 0.13-μm CMOS Technology, IEEE International Workshop 1 (IEEE 2009).
Behzad Razavi, A 60-GHz CMOS Receiver Front-End, IEEE Journal of Solid-State Circuits, vol. 41, No. 1, January 2006.
Chinh H. Doan. et.al, 60 GHz CMOS Radio for Gb/s Wireless LAN, Proceeding Symposium IEEE Radio Frequency Integrated Circuits,2004.
Alberto Valdes-Garcia, et.al, 60 GHz Transmitter Circuits in 65nm CMOS, Proceeding Symposium IEEE Radio Frequency Integrated Circuits, 2008.
Behzad Razavi et al, A mm-Wave CMOS Heterodyne Receiver with On-Chip LO and Divider, 2007 IEEE International Solid-State Circuits Conference.
Chao-Shiun Wang et al, A 0.13 μm CMOS Fully Differential Receiver with On-Chip Baluns for 60GHz Broadband Wireless Communications, IEEE 2008 Custom Integrated Circuits Conference (CICC).
Porra V. et al, Low Voltage Circuits for a single chip 2GHz transceiver for mobile telecommunication, 1996 IEEE International Symposium on circuits and systems (ISCAS).

* cited by examiner

FRONT-END TRANSCEIVER

CROSS-REFERENCE TO RELATED APPLICATION

This application claims the benefit of priority of U.S. provisional patent application No. 61/236,278 filed on 24 Aug. 2009, the contents of which is hereby incorporated by reference in its entirety for all purposes.

TECHNICAL FIELD

Embodiments relate to a front-end transceiver.

BACKGROUND

The 60 GHz industrial, scientific and medical (ISM) band may have received more attention recently due to a greater potential to revolutionize short-range high-speed Wireless Personal Area Network (WPAN) systems with low power consumption. In addition, as the transistor becomes smaller in dimension, it may give lower noise figure, higher power driving capability, better speed characteristics, higher packing density and higher unity-gain frequency ($f_T$). All these qualities may aid in higher integration, more compact and higher performance portable applications. The recent technology node supports $f_T$ greater than 120 GHz that may be more than twice the operating frequency of 60 GHz. The motivation for applications around 60 GHz frequencies may be the large bandwidth of about 7 GHz which may be unlicensed by Federal Communications Commission (FCC).

There may be many existing architectures which may be classified based on a selection of the number of intermediate stages of frequency translation between Radio Frequency (RF) signal and baseband frequency signal and also "frequency planning", by selection of Local Oscillator (LO) and intermediate frequencies (IF).

One architecture may include a 60G Direct-conversion architecture. This architecture may be termed as either Zero-IF architecture or as Homodyne architecture with $f_{LO}$=60 GHz. The frequency down conversion may be done in a single step to obtain the baseband signals. This architecture may be simple and straight-forward, making it well suited for monolithic integration. Since there may only be one mixing stage, there may not be an image band and the low noise amplifier (LNA) may not require a high image rejection ratio. However, at 60 GHz, it may be very difficult to generate LO I/Q components with less phase noise and a very stable oscillator. Since the LO may be very close to the RF frequency, there may be an issue of LO feedthrough. It may be followed by 1/f noise problem, high power consumption of frequency synthesizer to shift the frequency from VCO to 60 GHz using frequency multipliers, limited dynamic range and poor sensitivity. There may also be a risk of LO leakage to the antenna, which in turn may give rise to self-mixing of LO signal. The direct conversion using same RF and LO frequencies may lead to dynamic DC offset, which may affect the system's functionality. If the isolation may not be sufficient, the transmitter output may leak as LO of the receiver may lead to the transmission leakage self-mixing.

Another architecture may include a 30G/30G architecture. This architecture may also be termed as half RF architecture with $f_{LO}$=27 GHz, it may include 3 stages of down conversion of RF to baseband signal. Initially, by double conversion using same $f_{LO}$=27 GHz, obtained by frequency tripler on VCO of 9 GHz and then the third stage using a frequency divided LO of 6 GHz. Since it may be a multistage conversion, the demand on the VCO may be reduced. The first IF may have a frequency of 33 GHz which may be high and hence better image rejection, but on the contrary it may be very close to LO of 27 GHz and hence it may be difficult to separate LO interference from the IF and the LO feedthrough. The VCO may be driving two different unbalanced loads, additional circuitry and hence power consumption may be needed. To generate I/Q LO frequency for the third stage using divide by 3/2 may be difficult. Since the LO frequency and IF frequency may be an integer multiple of the RF frequency, the harmonics and sub-harmonics may lead to interference issues. The third harmonic of the LO which may mix with the 60 GHz RF, may give rise to the near IF frequency of 30 GHz. This harmonic interference may add on with the down-converted original IF and may degrade the performance of the transceiver.

Another architecture may include a 20G/40G architecture. This architecture may be simpler because it may have only 2 stages of conversion. The first stage $f_{LO}$=40 GHz may be far from the $f_{IF}$=20 GHz and hence no interference may effect. LO may have a considerable higher frequency and hence difficult to achieve VCO stability and frequency synthesis may have a higher power consumption. The same issue of unbalanced load for the VCO leading to additional circuitry may be prevailing here as well. The IF and LO frequency for the first stage may be integer multiples of RF signal and hence may lead to interference from harmonics and sub-harmonics.

Yet another architecture may include a 10G/50G architecture. This architecture may have the lowest IF frequency of 12 GHz and may have two stage frequency conversion. The demand on the I/Q generation may be reduced. The relatively low IF of 12-GHz may place a high demand on the image rejection on both the LNA and mixer. This architecture may need unconventional circuitry for VCO load balancing, leading to additional power consumption. The harmonics and sub-harmonics corruption may not be that high, since RF may be at a higher factor when compared to IF and LO. This architecture may provide a better rejection of nearby interferers and DC offset suppression, since the first stage LO may include a value of 48 GHz and thereby being considerably large. This may relax the Q-factor of the channel selection filter.

SUMMARY

In various embodiments, a front-end transceiver may be provided. The front-end transceiver may include a receiver path, including a first receiver frequency converter configured to convert a received signal with a receiver frequency into a first receiver intermediate signal with a first receiver intermediate frequency; and a receiver direct conversion stage coupled to the first receiver frequency converter so as to receive the first receiver intermediate signal. The front-end transceiver may further include an oscillator signal generator respectively coupled to the first receiver frequency converter and to the receiver direct conversion stage so as to provide a first oscillator signal with a first oscillator frequency to the first receiver frequency converter and a first stabilizing signal with a first stabilizing frequency to the receiver direct conversion stage; wherein the oscillator signal generator may be configured so that the first oscillator frequency of the first oscillator signal may be selected such that any integer multiple of the first oscillator frequency of the first oscillator signal may be different from any integer multiple of the receiver frequency of the received signal.

In various embodiments, the front-end transceiver may include a transmitter path, including a transmitter direct conversion stage configured to provide a transmitter signal to be transmitted with a transmitter frequency; and a first transmitter frequency converter coupled to the transmitter direct conversion stage so as to receive the transmitter signal to be transmitted with the transmitter frequency and to convert the transmitter signal to be transmitted with the transmitter frequency into a first transmitter intermediate signal with a first transmitter intermediate frequency. The front-end transceiver may also include an oscillator signal generator respectively coupled to the first transmitter frequency converter and to the transmitter direct conversion stage so as to provide a second oscillator signal with a second oscillator frequency to the first transmitter frequency converter and a second stabilizing signal with a second stabilizing frequency to the transmitter direct conversion stage; wherein the oscillator signal generator may be configured so that the second oscillator frequency of the second oscillator signal may be selected such that any integer multiple of the second oscillator frequency of the second oscillator signal may be different from any integer multiple of the first transmitter intermediate frequency of the first transmitter intermediate signal.

In various embodiment, the front-end transceiver may include a transmitter path, including a transmitter direct conversion stage configured to provide a transmitter signal to be transmitted with a transmitter frequency; a first transmitter frequency converter coupled to the transmitter direct conversion stage so as to receive the transmitter signal to be transmitted with the transmitter frequency and to convert the transmitter signal to be transmitted with the transmitter frequency into a first transmitter intermediate signal with a first transmitter intermediate frequency; and a second transmitter frequency converter coupled to the first transmitter frequency converter so as to receive the first transmitter intermediate signal with the first transmitter intermediate frequency and to convert the first transmitter intermediate signal with the first transmitter intermediate frequency into a second transmitter intermediate signal with a second transmitter intermediate frequency. The front-end transceiver may further include an oscillator signal generator respectively coupled to the first transmitter frequency converter, the second transmitter frequency converter and to the transmitter direct conversion stage so as to provide a second oscillator signal with a second oscillator frequency to the first transmitter frequency converter and the second transmitter frequency converter and a second stabilizing signal with a second stabilizing frequency to the transmitter direct conversion stage; wherein the oscillator signal generator may be configured so that the second oscillator frequency of the second oscillator signal may be selected such that any integer multiple of the second oscillator frequency of the second oscillator signal may be different from any integer multiple of the second transmitter intermediate frequency of the second transmitter intermediate signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments of the invention are described with reference to the following drawings, in which.

DESCRIPTION

Figure 1:
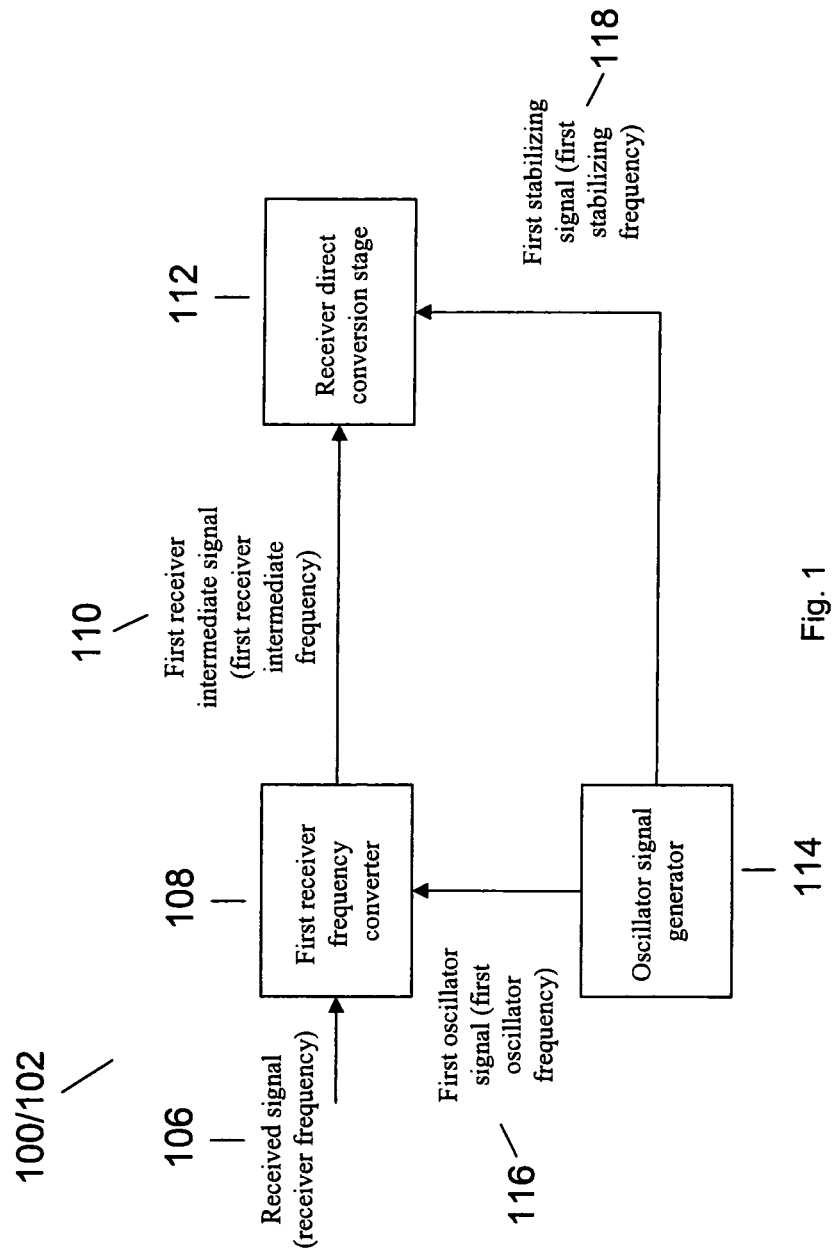
FIG. 1 shows a block level representation of a front-end transceiver including a receiver path according to an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments may be combined with one or more other embodiments to form new embodiments.

Various embodiments may provide for a front-end architecture termed as a 36G/24G transceiver architecture, for example. This architecture may include a hybrid structure of a super-heterodyne architecture and a direct conversion architecture which may combine respective features of the two architectures to reduce harmonics mixing and harmonics feedthrough. Careful selection of respective intermediate frequency and local oscillator frequency such that any integer multiple of the respective first stage LO frequency and IF frequency may not overlap with any integer multiple of the RF frequency may allow the multi-stage architecture to achieve low power consumption and less silicon area.

Various embodiments provide for an alternative front-end transceiver which may overcome or reduce at least alleviate some of the above-mentioned problems of the above-mentioned conventional architectures.

In an embodiment, the architecture may have the first LO frequency at 36 GHz (being near the center value of LO) and thereby moderate the disadvantages of some of the state of the art topologies. Further, the first IF at 24 GHz may provide a better image rejection performance and low requirement on image rejection LNA and mixer design. The LO frequency may include a value substantially different from the respective RF and IF signals, thereby leading to less inter-modulation interference. The LO of 36 GHz may be achieved without frequency doublers or triplers, thereby reducing the power and area consumption.

In an embodiment, one effect of the topology of the hybrid structure may be the reuse of 24 GHz car industry IP for the IF mixer stages of both the receiver and the transmitter, hence reducing the implementation design cycle and eventually the development cost. The topology may be symmetrical about the transmitter and receiver, thus taking care of mismatch issues at the circuit level implementation. The load on the VCO and dividers may be balanced and both the transmitter and receiver may share the same quadrature and differential LO signals. Since as the first stage may include $f_{LO}$=36 GHz and $f_{IF}$=24 GHz, both may not be direct frequency multiples of the RF 60 GHz frequency. This may reduce the influence of harmonics and sub-harmonics during the mixer phase.

Further, the architecture of the front-end transceiver according to the various embodiments may be able to support multiple-input and multiple-output (MIMO) or use of multiple antennas at both the transmitter path and receiver path to improve communication performance. In addition, each of the transmitter path and the receiver path may include a common antenna or their respective antenna(s) depending on user and design requirements.

FIG. 1 shows a block level representation of a front-end transceiver 100 including a receiver path 102 according to an embodiment.

The receiver path 102 may include a first receiver frequency converter 108 configured to convert a received signal 106 with a receiver frequency into a first receiver intermediate signal 110 with a first receiver intermediate frequency; and a receiver direct conversion stage 112 coupled to the first receiver frequency converter 108 so as to receive the first receiver intermediate signal 110. The front-end transceiver 100 may further include an oscillator signal generator 114 respectively coupled to the first receiver frequency converter 108 and to the receiver direct conversion stage 112 so as to provide a first oscillator signal 116 with a first oscillator frequency to the first receiver frequency converter 108 and a first stabilizing signal 118 with a first stabilizing frequency to the receiver direct conversion stage 112; wherein the oscillator signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

Figure 2:
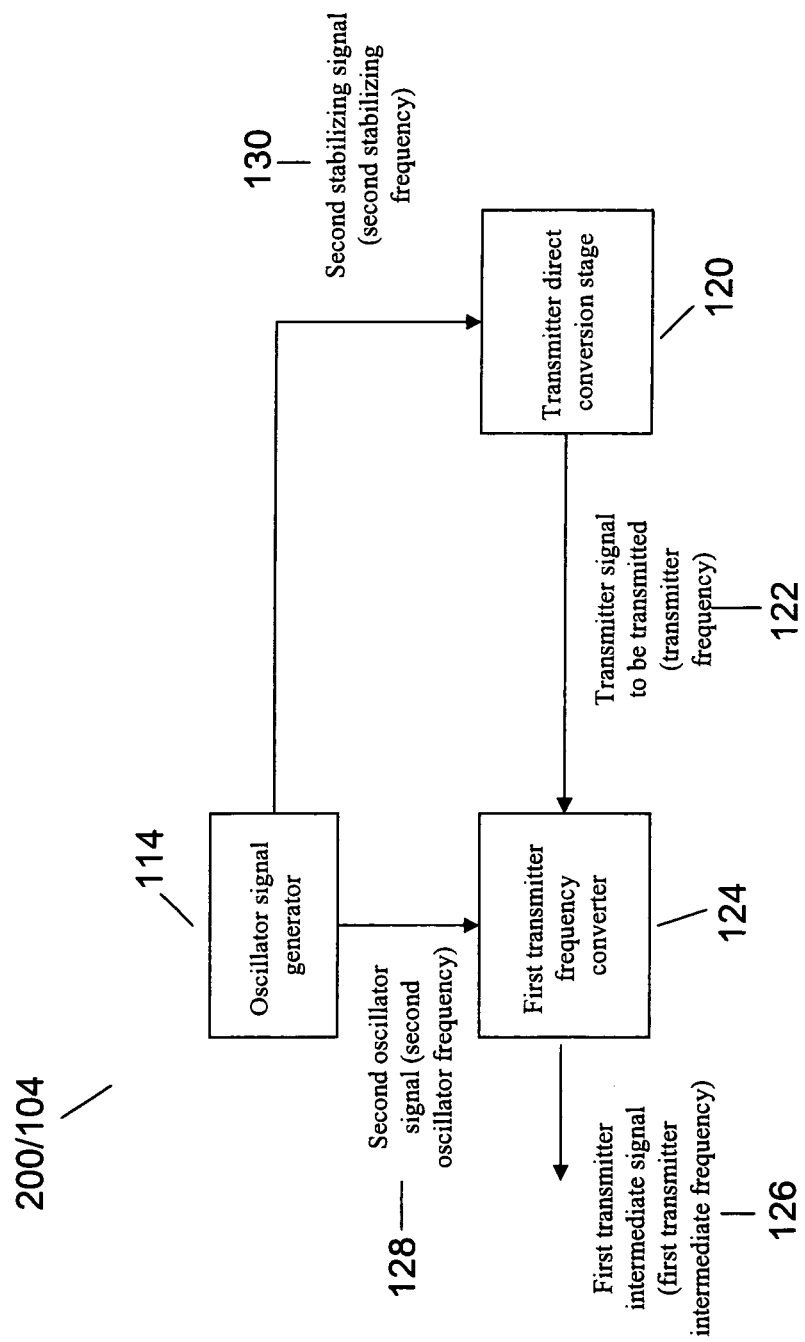
FIG. 2 shows a block level representation of a front-end transceiver including a transmitter path according to an embodiment.

FIG. 2 shows a block level representation of a front-end transceiver 200 including a transmitter path 104 according to an embodiment.

The transmitter path 104 may include a transmitter direct conversion stage 120 configured to provide a transmitter signal 122 to be transmitted with a transmitter frequency; and a first transmitter frequency converter 124 coupled to the transmitter direct conversion stage 120 so as to receive the transmitter signal 122 to be transmitted with the transmitter frequency and to convert the transmitter signal 122 to be transmitted with the transmitter frequency into a first transmitter intermediate signal 126 with a first transmitter intermediate frequency. Further, the front-end transceiver 200 may further include an oscillator signal generator 114 respectively coupled to the first transmitter frequency converter 124 and to the transmitter direct conversion stage 120 so as to provide a second oscillator signal 128 with a second oscillator frequency to the first transmitter frequency converter 124 and a second stabilizing signal 130 with a second stabilizing frequency to the transmitter direct conversion stage 120; wherein the oscillator signal generator 114 may be configured so that the second oscillator frequency of the second oscillator signal 128 may be selected such that any integer multiple of the second oscillator frequency of the second oscillator signal 128 may be different from any integer multiple of the first transmitter intermediate frequency of the first transmitter intermediate signal 126.

Figure 3:
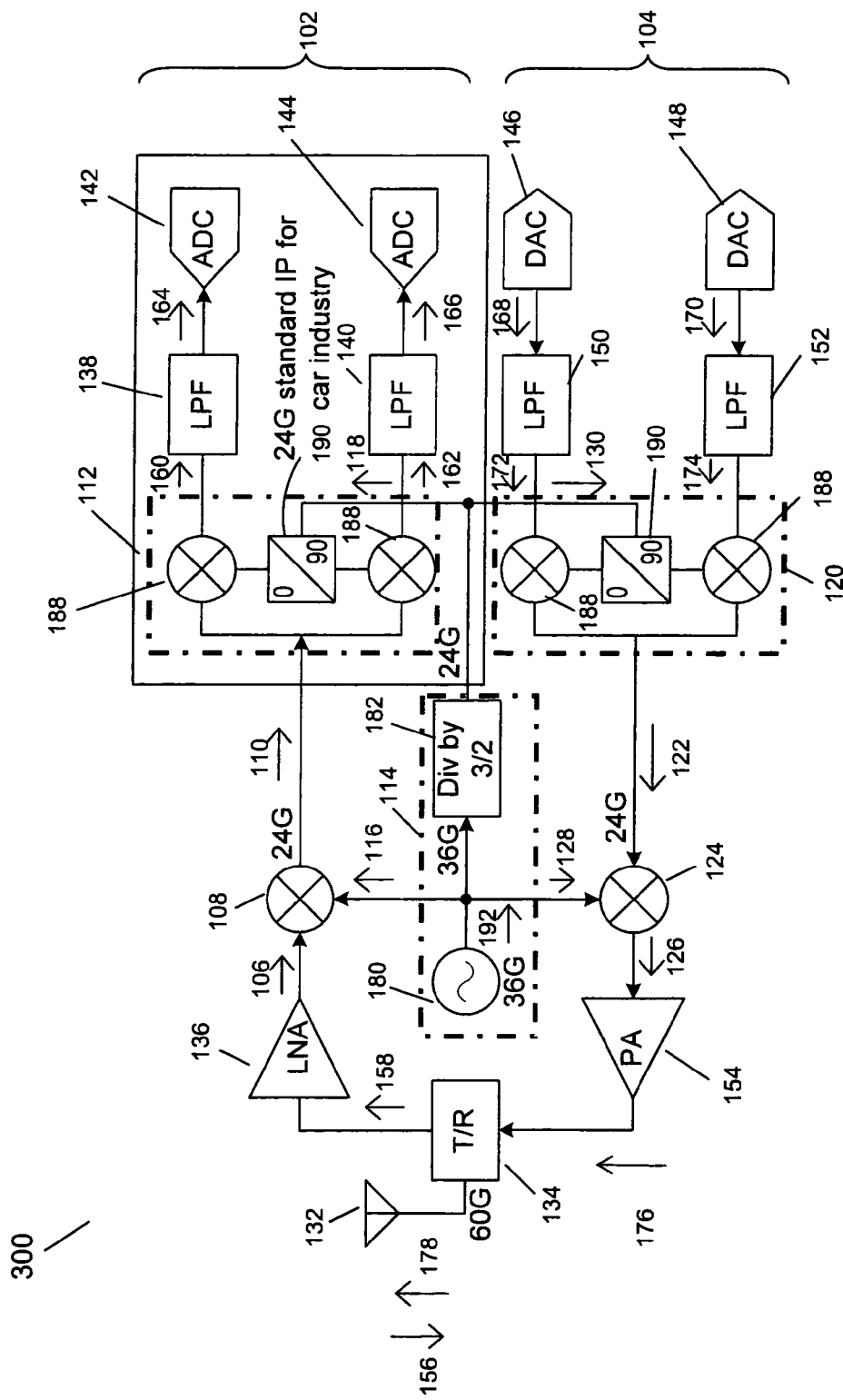
FIG. 3 shows a schematic diagram of a front-end transceiver including a receiver path having a first receiver frequency converter, a transmitter path having a first transmitter frequency converter and an oscillator signal generator coupled to both the first receiver frequency converter and the first transmitter frequency converter, the oscillator signal generator having an oscillator and a first compensating circuit according to an embodiment.

FIG. 3 shows a schematic diagram of a front-end transceiver 300 including a receiver path 102 having a first receiver frequency converter 108, a transmitter path 104 having a first transmitter frequency converter 124 and an oscillator signal generator 114 coupled to both the first receiver frequency converter 108 and the first transmitter frequency converter 124, the oscillator signal generator 114 having an oscillator 180 and a first compensating circuit 182 according to an embodiment.

In FIG. 3, the receiver path 102 may include an antenna 132 configured to receive an incoming signal 156 with an incoming frequency and a transmitter/receiver (T/R) module 134 coupled to the antenna 132 so as to receive and convert the incoming signal 156 to an incoming receiver signal 158 with an incoming receiver frequency to be channeled along the receiver path 102. The receiver path 102 may further include a low noise amplifier (LNA) 136 coupled to the T/R module 134 so as to receive and amplify the incoming receiver signal 158 into a received signal 106 with a receiver frequency. In FIG. 3, it may be shown that the receiver path 102 may include one low noise amplifier 136, however, the receiver path 102 may include any suitable number of low noise amplifiers 136 depending on users' specifications and design requirements). Usually, depending on the users' specifications and design requirements, there may be multiple stages of low noise amplifiers in the receiver path 102.

The receiver path 102 may also include the first receiver frequency converter 108 coupled to the low noise amplifier 136 so as to receive and convert the received signal 106 with the receiver frequency into a first receiver intermediate signal 110 with a first receiver intermediate frequency. The receiver path 102 may further include the receiver direct conversion stage 112 coupled to the first receiver frequency converter 108 so as to receive and convert the first receiver intermediate signal 110 into respective in-phase (I) receiver signal 160 and quadrature-phase (Q) receiver signal 162. The respective in-phase receiver signal 160 and quadrature-phase receiver signal 162 may be about 90 degree out of phrase with each other. The receiver path 102 may then include an in-phase receiver low pass filter (LPF) 138 and a quadrature-phase receiver low pass filter 140 respectively coupled to the receiver direct conversion stage 112 so as to receive and filter the respective in-phase receiver signal 160 and quadrature-phase receiver signal 162, and further convert into respective in-phase receiver analogue signal 164 and quadrature-phase receiver analogue signal 166. The receiver path 102 may include an in-phase receiver analogue to digital converter (ADC) 142 and a quadrature-phase receiver analogue to digital converter 144 respectively coupled to the in-phase receiver low pass filter 138 and the quadrature-phase receiver low pass filter 140 so as to receive the respective in-phase receiver analogue signal 164 and quadrature-phase receiver analogue signal 166 and convert the respective in-phase receiver analogue signal 164 and quadrature-phase receiver analogue signal 166 into respective digital output signals (not shown).

The transmitter path 104 may include an in-phase transmitter digital to analogue (DAC) converter 146 and a quadrature-phase transmitter digital to analogue converter 148 respectively configured to receive digital input signals (not shown) and convert the digital input signals into respective in-phase transmitter analogue signal 168 and quadrature-phase transmitter analogue signal 170. The transmitter path 104 may further include an in-phase transmitter low pass filter 150 and a quadrature-phase transmitter low pass filter 152 respectively coupled to the in-phase transmitter digital to analogue converter 146 and the quadrature-phase transmitter digital to analogue converter 148 so as to receive and convert the respective in-phase transmitter analogue signal 168 and quadrature-phase transmitter analogue signal 170 into respective in-phase transmitter signal 172 and quadrature-phase transmitter signal 174. The transmitter path 104 may also include a transmitter direct conversion stage 120 coupled to the respective in-phase transmitter low pass filter 150 and quadrature-phase transmitter low pass filter 152 so as to receive and convert the respective in-phase transmitter signal 172 and quadrature-phase transmitter signal 174 into a transmitter signal 122 to be transmitted with a transmitter frequency. The transmitter path 104 may further include the first transmitter frequency converter 124 coupled to the transmitter direct conversion stage 120 so as to receive the transmitter signal 122 to be transmitted with the transmitter frequency and to convert the transmitter signal 122 to be transmitted with the transmitter frequency into a first transmitter intermediate signal 126 with a first transmitter intermediate frequency.

The transmitter path 104 may also include a power amplifier (PA) 154 coupled to the first transmitter frequency converter 124 so as to receive the first transmitter intermediate signal 126 and to amplify the first transmitter intermediate signal 126 into an out-going transmitter signal 176 with an out-going transmitter frequency. The transmitter path 104 may also include the Tx/Rx module 134 coupled to the power amplifier 154 so as to allow the channeling of the outgoing transmitter signal 176 into an out-going signal 178 of an outgoing frequency out of the Tx/Rx module 134. The outgoing signal 178 may be transmitted out of the front-end transceiver 300 via the antenna 132.

In FIG. 3, the antenna 132 may be the same for both the receiver path 102 and the transmitter path 104 and the Tx/Rx module 134 may be the same for both the receiver path 102 and the transmitter path 104. However, the antenna 132 may also be different for each of the receiver path 102 and the transmitter path 104.

The front-end transceiver 300 may further include the oscillator signal generator 114 respectively coupled to the first receiver frequency converter 108 and to the receiver direct conversion stage 112 so as to provide a first oscillator signal 116 with a first oscillator frequency to the first receiver frequency converter 108 and a first stabilizing signal 118 with a first stabilizing frequency to the receiver direct conversion stage 112.

Further, the oscillator signal generator 114 may be configured so that the first oscillator frequency of the first oscillator signal 116 may be selected such that any integer multiple of the first oscillator frequency of the first oscillator signal 116 (and also any integer multiple of the first receiver intermediate signal 110 with the first receiver intermediate frequency) may be different from any integer multiple of the receiver frequency of the received signal 106.

The oscillator signal generator 114 may also be configured so that the first stabilizing frequency of the first stabilizing signal 118 may be substantially the same as the first receiver intermediate frequency of the first receiver intermediate signal 110.

In addition, the first receiver frequency converter 108 may be configured so that the first receiver intermediate frequency of the first receiver intermediate signal 110 may include a value of which may be determined based on a deviation between the receiver frequency of the received signal 106 and the first oscillator frequency of the first oscillator signal 116.

The oscillator signal generator 114 may be further coupled to the first transmitter frequency converter 124 so as to provide a second oscillator signal 128 with a second oscillating frequency to the first transmitter frequency converter 124. The oscillator signal generator 114 may also be coupled to the transmitter direct conversion stage 120 so as to provide a second stabilizing signal 130 with a second stabilizing frequency to the transmitter direct conversion stage 120.

Further, the oscillator signal generator 114 may be configured so that the second oscillator frequency of the second oscillator signal 128 may be selected such that any integer multiple of the second oscillator frequency of the second oscillator signal 128 (and also any integer multiple of the transmitter signal 122 to be transmitted with the transmitter frequency) may be different from any integer multiple of the first transmitter intermediate frequency of the first transmitter intermediate signal 126.

The oscillator signal generator 114 may also be configured so that the second stabilizing frequency of the second stabilizing signal 130 may be substantially the same as the transmitter frequency of the transmitter signal 122 to be transmitted.

The first transmitter frequency converter 124 may be configured so that the first transmitter intermediate frequency of the first transmitter intermediate signal 126 may include a value of which may be determined based on an addition of the transmitter frequency of the transmitter signal 122 to be transmitted and the second oscillator frequency of the second oscillator signal 128.

The oscillator signal generator 114 may include an oscillator 180 (or termed local oscillator (LO)) configured to generate an initial oscillator signal 192 with an initial oscillator frequency. The oscillator signal generator 114 may be configured such that the first oscillator signal 116 with the first oscillator frequency may be substantially the same as the initial oscillator signal 192 with the initial oscillator frequency. The oscillator signal generator 114 may be further configured such that the second oscillator signal 128 with the second oscillator frequency may be substantially the same as the initial oscillator signal 192 with the initial oscillator frequency.

The oscillator signal generator 114 may further include a first compensating circuit 182 coupled to the oscillator 180 so as to receive the initial oscillator signal 192 with the initial oscillator frequency and to convert the initial oscillator signal 192 with the initial oscillator frequency to the first stabilizing signal 118 with the first stabilizing frequency. The first compensating circuit 182 may be further configured to convert the initial oscillator signal 192 with the initial oscillator frequency to the second stabilizing signal 130 with the second stabilizing frequency. In FIG. 3, the first stabilizing signal 118 with the first stabilizing frequency may be substantially the same as the second stabilizing signal 130 with the second stabilizing frequency.

In an embodiment, each of the first receiver frequency converter 108 and the first transmitter frequency converter 124 may include a mixer. Each of the receiver direct conversion stage 112 and the transmitter direct conversion stage 120 may include a 0-90 phase-shifter 190 and two mixers 188. The 0-90 phase-shifter 190 may be configured such that the in-phase receiver signal 160 and the quadrature-phase receiver signal 162 may be about 0 and 90 degree phase shifted from each other and also configured such that the in-phase transmitter signal 172 and the quadrature-phase transmitter signal 174 may be about 0 and 90 degree phase shifted from each other. The first compensating circuit 182 may include a divider, for example a 3/2 divider.

The oscillator signal generator 114 may include any combination and arrangement of the oscillator 180 and the first compensating circuit 182 as long as the oscillator signal generator 114 may be configured such that any integer multiple of the first oscillator frequency may be different from any integer multiple of the receiver frequency of the received signal 106 or any integer multiple of the second oscillator frequency may be different from any integer multiple of the first transmitter intermediate frequency. Further, the first stabilizing frequency may be substantially the same as the first receiver intermediate frequency and the second stabilizing frequency may be substantially the same as the transmitter frequency. Further, the values of the initial oscillator frequency of the initial oscillator signal 192 of the oscillator 180 and the division values of the first compensating circuit 182 may be varied accordingly as long as these criteria may be fulfilled.

As an example of the selection of the suitable frequency values within the front-end transceiver 300 as shown in FIG. 3, in the receiver path 102, the receiver frequency may be similar to the incoming frequency and the receiver frequency may be about 60 GHz. The oscillator signal generator 114 may be configured to provide the first oscillator signal 116 with the first oscillator frequency of about 36 GHz. Therefore, the first receiver frequency converter 108 may be configured to provide the first receiver intermediate signal 110 with the first receiver intermediate frequency of about 24 GHz (60 GHz−36 GHz=24 GHz). In this regard, any integer multiple of the first oscillator frequency (i.e. 36 GHz, 72 GHz, 108 GHz, 144 GHz, for example) of the first oscillator signal 116 and thereby any integer multiple of the first receiver intermediate frequency (i.e. 24 GHz, 48 GHz, 72 GHz, 96 GHz, for example) of the first receiver intermediate signal 110 may be respectively different from or may not coincide with any integer multiple of the receiver frequency of the received signal 106 (i.e. 60 GHz, 120 GHz, 180 GHz, 240 GHz, for example) so as to reduce the influence of harmonics and sub-harmonics during the frequency converting or mixer phase. Further, the first receiver intermediate frequency of about 24 GHz may also render the front-end transceiver 300 to be suitable for the 24 GHz car industry IP.

Similarly, in the transmitter path 104, the first transmitter intermediate frequency may be similar to the outgoing frequency and the first transmitter intermediate frequency may be about 60 GHz. The oscillator signal generator 114 may be configured to provide the second oscillator signal 128 with the second oscillator frequency of about 36 GHz. Therefore, the first transmitter frequency converter 124 may be configured to provide the transmitter signal 122 to be transmitted with the transmitter frequency of about 24 GHz (60 GHz−36 GHz=24 GHz). In this regard, any integer multiple of the second oscillator frequency (i.e. 36 GHz, 72 GHz, 108 GHz, 144 GHz, for example) of the second oscillator signal 128 and thereby any integer multiple of the transmitter frequency (i.e. 24 GHz, 48 GHz, 72 GHz, 96 GHz, for example) of the transmitter signal 122 to be transmitted may be respectively different from or may not coincide with any integer multiple of the first transmitter intermediate frequency of the first transmitter intermediate signal 126 (i.e. 60 GHz, 120 GHz, 180 GHz, 240 GHz, for example) so as to reduce the influence of harmonics and sub-harmonics during the frequency converting or mixer phase.

Further, the oscillator signal generator 114 may also be configured so that the first stabilizing frequency (i.e. 24 GHz) of the first stabilizing signal 118 may be substantially the same as the first receiver intermediate frequency (e.g. 24 GHz) of the first receiver intermediate signal 110 and the second stabilizing frequency (i.e. 24 GHz) of the second stabilizing signal 130 may be substantially the same as the transmitter frequency (e.g. 24 GHz) of the transmitter signal 122 to be transmitted.

The oscillator signal generator 114 may be configured such that the first oscillator signal 116 with the first oscillator frequency (i.e. 36 GHz) may be substantially the same as the initial oscillator signal 192 with the initial oscillator frequency (i.e. 36 GHz). The oscillator signal generator 114 may also be configured such that the second oscillator signal 128 with the second oscillator frequency (i.e. 36 GHz) may be substantially the same as the initial oscillator signal 192 with the initial oscillator frequency (i.e. 36 GHz). Therefore, the first oscillator frequency (i.e. 36 GHz) may be substantially the same as the second oscillator frequency (i.e. 36 GHz).

Figure 4:
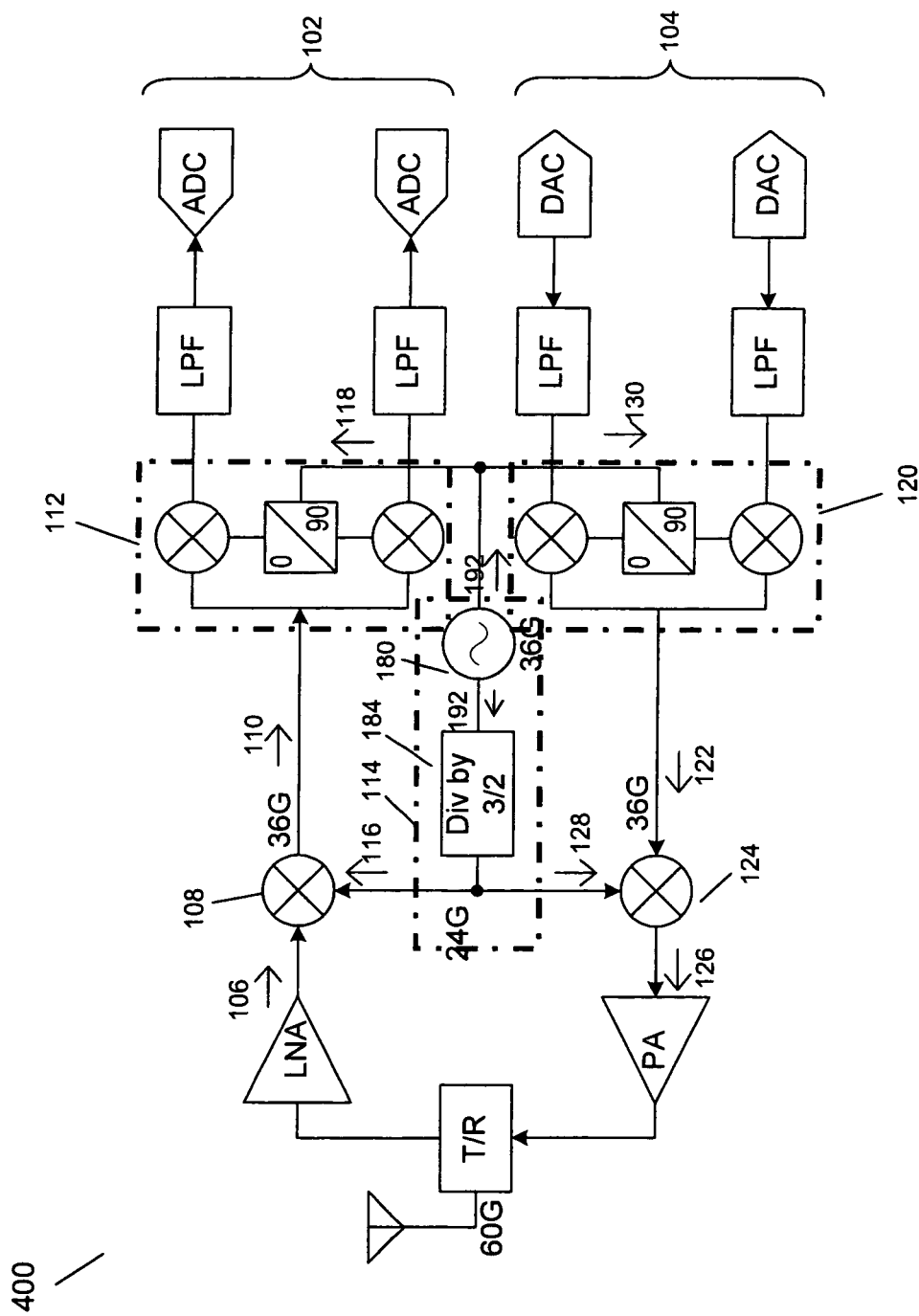
FIG. 4 shows a schematic diagram of a front-end transceiver including a receiver path having a first receiver frequency converter, a transmitter path having a first transmitter frequency converter and an oscillator signal generator coupled to both the first receiver frequency converter and the first transmitter frequency converter, the oscillator signal generator having an oscillator and a second compensating circuit according to an embodiment.

FIG. 4 shows a schematic diagram of a front-end transceiver 400 including a receiver path 102 having a first receiver frequency converter 108, a transmitter path 104 having a first transmitter frequency converter 124 and an oscillator signal generator 114 coupled to both the first receiver frequency converter 108 and the first transmitter frequency converter 124, the oscillator signal generator 114 having an oscillator 180 and a second compensating circuit 184 according to an embodiment.

The front-end transceiver 400 as shown in FIG. 4 may be similar to the front-end transceiver 300 as shown in FIG. 3 with the difference in the oscillator signal generator 114. The oscillator signal generator 114 in FIG. 4 may include the oscillator 180 and the second compensating circuit 184 while the oscillator signal generator 114 in FIG. 3 may include the oscillator 180 and the first compensating circuit 182.

In more details, FIG. 4 shows the receiver path 102 including the first receiver frequency converter 108 configured to convert a received signal 106 with a receiver frequency into a first receiver intermediate signal 110 with a first receiver intermediate frequency; and a receiver direct conversion stage 112 coupled to the first receiver frequency converter 108 so as to receive the first receiver intermediate signal 110. The front-end transceiver 400 may further include an oscillator signal generator 114 respectively coupled to the first receiver frequency converter 108 and to the receiver direct conversion stage 112 so as to provide a first oscillator signal 116 with a first oscillator frequency to the first receiver frequency converter 108 and a first stabilizing signal 118 with a first stabilizing frequency to the receiver direct conversion stage 112; wherein the oscillator signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

The oscillator signal generator 114 may be configured so that the first stabilizing frequency of the first stabilizing signal 118 may be substantially the same as the first receiver intermediate frequency of the first receiver intermediate signal 110. Further, the first receiver frequency converter 108 may be configured so that the first receiver intermediate frequency of the first receiver intermediate signal 110 may include a value of which may be determined based on a deviation between the receiver frequency of the received signal 106 and the first oscillator frequency of the first oscillator signal 116.

The front-end transceiver 400 may further include the transmitter path 104, including a transmitter direct conversion stage 120 configured to provide a transmitter signal 122 to be transmitted with a transmitter frequency. The transmitter path 104 may further include the first transmitter frequency converter 124 coupled to the transmitter direct conversion stage 120 so as to receive the transmitter signal 122 to be transmitted with the transmitter frequency and to convert the transmitter signal 122 to be transmitted with the transmitter frequency into a first transmitter intermediate signal 126 with a first transmitter intermediate frequency.

The oscillator signal generator 114 may be coupled to the first transmitter frequency converter 124 so as to provide a second oscillator signal 128 with a second oscillating frequency to the first transmitter frequency converter 124. The oscillator signal generator 114 may be coupled to the transmitter direct conversion stage 120 so as to provide a second stabilizing signal 130 with a second stabilizing frequency to the transmitter direct conversion stage 120.

The first transmitter frequency converter 124 may be configured so that the first transmitter intermediate frequency of the first transmitter intermediate signal 126 may include a value of which may be determined based on an addition of the transmitter frequency of the transmitter signal 122 to be transmitted and the second oscillator frequency of the second oscillator signal 128.

The oscillator signal generator 114 may include an oscillator 180 configured to generate an initial oscillator signal 192 with an initial oscillator frequency. The oscillator signal generator 114 may further include a second compensating circuit 184 coupled to the oscillator 180 so as to receive the initial oscillator signal 192 with the initial oscillator frequency and to convert the initial oscillator signal 192 with the initial oscillator frequency to the first oscillator signal 116 with the first oscillator frequency. The second compensating circuit 184 may be further configured to convert the initial oscillator signal 192 with the initial oscillator frequency to the second oscillator signal 128 with the second oscillator frequency. The second compensating circuit 184 may be respectively coupled to the first receiver frequency converter 108 and the first transmitter frequency converter 124.

The oscillator 180 may be coupled to the receiver direct conversion stage 112 such that the initial oscillator frequency of the initial oscillator signal 192 may be substantially the same as the first stabilizing frequency of the first stabilizing signal 118. The oscillator 180 may be coupled to the transmitter direct conversion stage 120 such that the initial oscillator signal 192 with the initial oscillator frequency may be substantially the same as the second stabilizing signal 130 with the second stabilizing frequency.

As an example of the selection of the suitable frequency values within the front-end transceiver 400 as shown in FIG. 4, in the receiver path 102, the receiver frequency may be similar to the incoming frequency and the receiver frequency may be about 60 GHz. The oscillator signal generator 114 may be configured to provide the first oscillator signal 116 with the first oscillator frequency of about 24 GHz. Therefore, the first receiver frequency converter 108 may be configured to provide the first receiver intermediate signal 110 with the first receiver intermediate frequency of about 36 GHz (60 GHz–24 GHz=36 GHz). In this regard, any integer multiple of the first oscillator frequency (i.e. 24 GHz, 48 GHz, 72 GHz, 96 GHz, for example) of the first oscillator signal 116 and thereby any integer multiple of the first receiver intermediate frequency (i.e. 36 GHz, 72 GHz, 108 GHz, 144 GHz, for example) of the first receiver intermediate signal 110 may be respectively different from or may not coincide with any integer multiple of the receiver frequency of the received signal 106 (i.e. 60 GHz, 120 GHz, 180 GHz, 240 GHz, for example) so as to reduce the influence of harmonics and sub-harmonics during the frequency converting or mixer phase.

Similarly, in the transmitter path 104, the transmitter direct conversion stage 120 may be configured to provide the transmitter signal 122 to be transmitted with the transmitter frequency of about 36 GHz. The oscillator signal generator 114 may be configured to provide the second oscillator signal 128 with the second oscillator frequency of about 24 GHz. Therefore, the first transmitter frequency converter 124 may be configured to provide the first transmitter intermediate frequency of about 60 GHz (i.e. 36 GHz+24 GHz) which may be similar to the outgoing frequency. In this regard, any integer multiple of the second oscillator frequency (i.e. 24 GHz, 48 GHz, 72 GHz, 96 GHz, for example) of the second oscillator signal 128 and thereby any integer multiple of the transmitter frequency (i.e. 36 GHz, 72 GHz, 108 GHz, 144 GHz, for example) of the transmitter signal 122 to be transmitted may be respectively different from or may not coincide with any integer multiple of the first transmitter intermediate frequency of the first transmitter intermediate signal 126 (i.e. 60 GHz, 120 GHz, 180 GHz, 240 GHz, for example) so as to reduce the influence of harmonics and sub-harmonics during the frequency converting or mixer phase.

Further, the oscillator signal generator 114 may also be configured so that the first stabilizing frequency (i.e. 36 GHz) of the first stabilizing signal 118 may be substantially the same as the first receiver intermediate frequency (e.g. 36 GHz) of the first receiver intermediate signal 110 and the second stabilizing frequency (i.e. 36 GHz) of the second stabilizing signal 130 may be substantially the same as the transmitter frequency (e.g. 36 GHz) of the transmitter signal 122 to be transmitted.

The oscillator signal generator 114 may be configured such that the initial oscillator signal 192 with the initial oscillator frequency (i.e. about 36 GHz) may be substantially the same as the respective first stabilizing signal 118 with the first stabilizing frequency (i.e. 36 GHz) and the second stabilizing signal 130 with the second stabilizing frequency (i.e. 36 GHz). Further, the second compensating circuit 184 may include a 3/2 divider such that the respective first oscillator frequency of the first oscillator signal 116 and the second oscillator frequency of the second oscillator signal 128 may be substantially the same (i.e. 36 GHz divided by (3/2)=>24 GHz).

Figure 5:
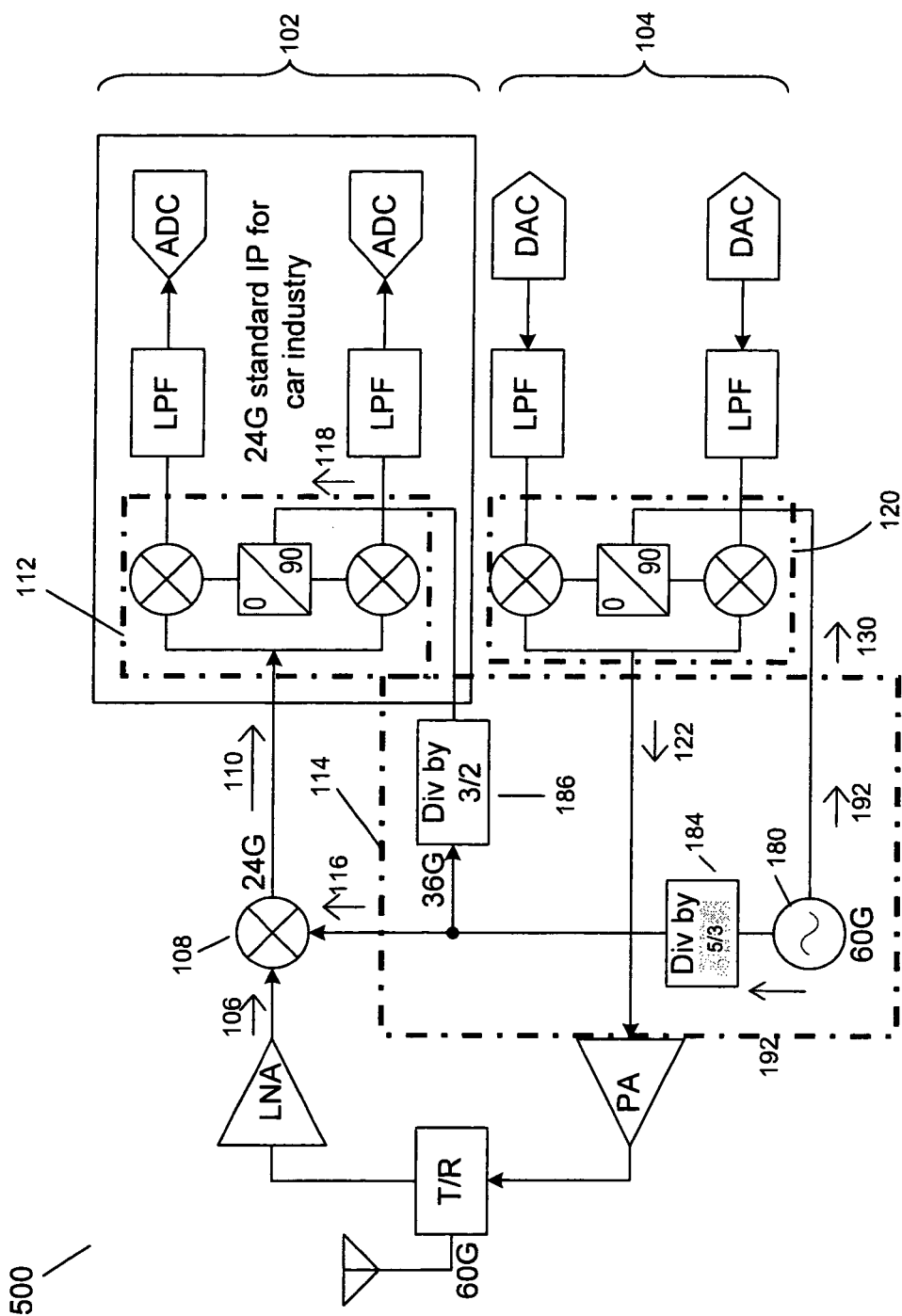
FIG. 5 shows a schematic diagram of a front-end transceiver including a receiver path having a first receiver frequency converter and an oscillator signal generator coupled to the first receiver frequency converter, the oscillator signal generator having an oscillator, a second compensating circuit and a third compensating circuit according to an embodiment.

FIG. 5 shows a schematic diagram of a front-end transceiver 500 including a receiver path 102 having a first receiver frequency converter 108 and an oscillator signal generator 114 coupled to the first receiver frequency converter 108, the oscillator signal generator 114 having an oscillator 180, a second compensating circuit 184 and a third compensating circuit 186 according to an embodiment.

The front-end transceiver 500 as shown in FIG. 5 may be similar to the front-end transceiver 400 as shown in FIG. 4 with the difference in the oscillator signal generator 114. The oscillator signal generator 114 in FIG. 5 may include the oscillator 180, the second compensating circuit 184 and the third compensating circuit 186 while the oscillator signal generator 114 in FIG. 4 may include an oscillator 180 and a second compensating circuit 184. Further, the front-end transceiver 500 as shown in FIG. 5 may not include a first transmitter frequency converter 124 unlike the front-end transceiver 400 as shown in FIG. 4.

In more details, FIG. 5 shows the receiver path 102 including the first receiver frequency converter 108 configured to convert a received signal 106 with a receiver frequency (i.e 60 GHz) into a first receiver intermediate signal 110 with a first receiver intermediate frequency (i.e. 24 GHz); and a receiver direct conversion stage 112 coupled to the first receiver frequency converter 108 so as to receive the first receiver intermediate signal 110. The front-end transceiver 500 may further include an oscillator signal generator 114 respectively coupled to the first receiver frequency converter 108 and to the receiver direct conversion stage 112 so as to provide a first oscillator signal 116 with a first oscillator frequency (i.e. about 36 GHz) to the first receiver frequency converter 108 and a first stabilizing signal 118 with a first stabilizing frequency (i.e about 24 GHz) to the receiver direct conversion stage 112; wherein the oscillator signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

The oscillator signal generator 114 may be configured so that the first stabilizing frequency of the first stabilizing signal 118 may be substantially the same as the first receiver intermediate frequency of the first receiver intermediate signal 110. Further, the first receiver frequency converter 108 may be configured so that the first receiver intermediate frequency of the first receiver intermediate signal 110 may include a value of which may be determined based on a deviation between the receiver frequency of the received signal 106 and the first oscillator frequency of the first oscillator signal 116.

As shown in FIG. 5, the incoming frequency and thereby the receiver frequency may be about 60 GHz. The oscillator signal generator 114 may be configured to provide the first oscillator signal 116 with the first oscillator frequency of about 36 GHz. Therefore, the first receiver frequency converter 108 may be configured to provide the first receiver intermediate signal 110 with the first receiver intermediate frequency of about 24 GHz (i.e. 60 GHz−36 GHz).

The front-end transceiver 500 may further include the transmitter path 104, including a transmitter direct conversion stage 120 configured to provide a transmitter signal 122 to be transmitted with a transmitter frequency (i.e. 60 GHz).

The oscillator signal generator 114 may be coupled to the transmitter direct conversion stage 120 so as to provide a second stabilizing signal 130 with a second stabilizing frequency (i.e. 60 GHz) to the transmitter direct conversion stage 120.

The oscillator signal generator 114 may include an oscillator 180 configured to generate an initial oscillator signal 192 with an initial oscillator frequency (i.e. 60 GHz). The oscillator signal generator 114 may further include a second compensating circuit 184 (i.e. 5/3 divider) coupled to the oscillator 180 so as to receive the initial oscillator signal 192 with the initial oscillator frequency and to convert the initial oscillator signal 192 with the initial oscillator frequency to the first oscillator signal 116 with the first oscillator frequency (i.e 60 GHz divided by (5/3)=>36 GHz).

The oscillator 180 may be coupled to the transmitter direct conversion stage 120 such that the initial oscillator signal 192 with the initial oscillator frequency may be substantially the same as the second stabilizing signal 130 with the second stabilizing frequency. The oscillator signal generator 114 may further include a third compensating circuit 186 (i.e. 3/2 divider) coupled to the second compensating circuit 184 so as to receive the first oscillator signal 116 with the first oscillator frequency and to convert the first oscillator signal 116 with the first oscillator 180 frequency to the first stabilizing signal 118 with the first stabilizing frequency (i.e 36 GHz divided by (3/2)=>24 GHz). The values of the oscillator 180, the second compensating circuit 184 and the third compensating circuit 186 may vary accordingly such that the previous mentioned criteria may be satisfied.

In FIG. 5, it may be advantageous for the first receiver intermediate frequency of the first receiver intermediate signal 110 to include a value of about 24 GHz so as to be deemed suitable for the car industry.

Figure 6:
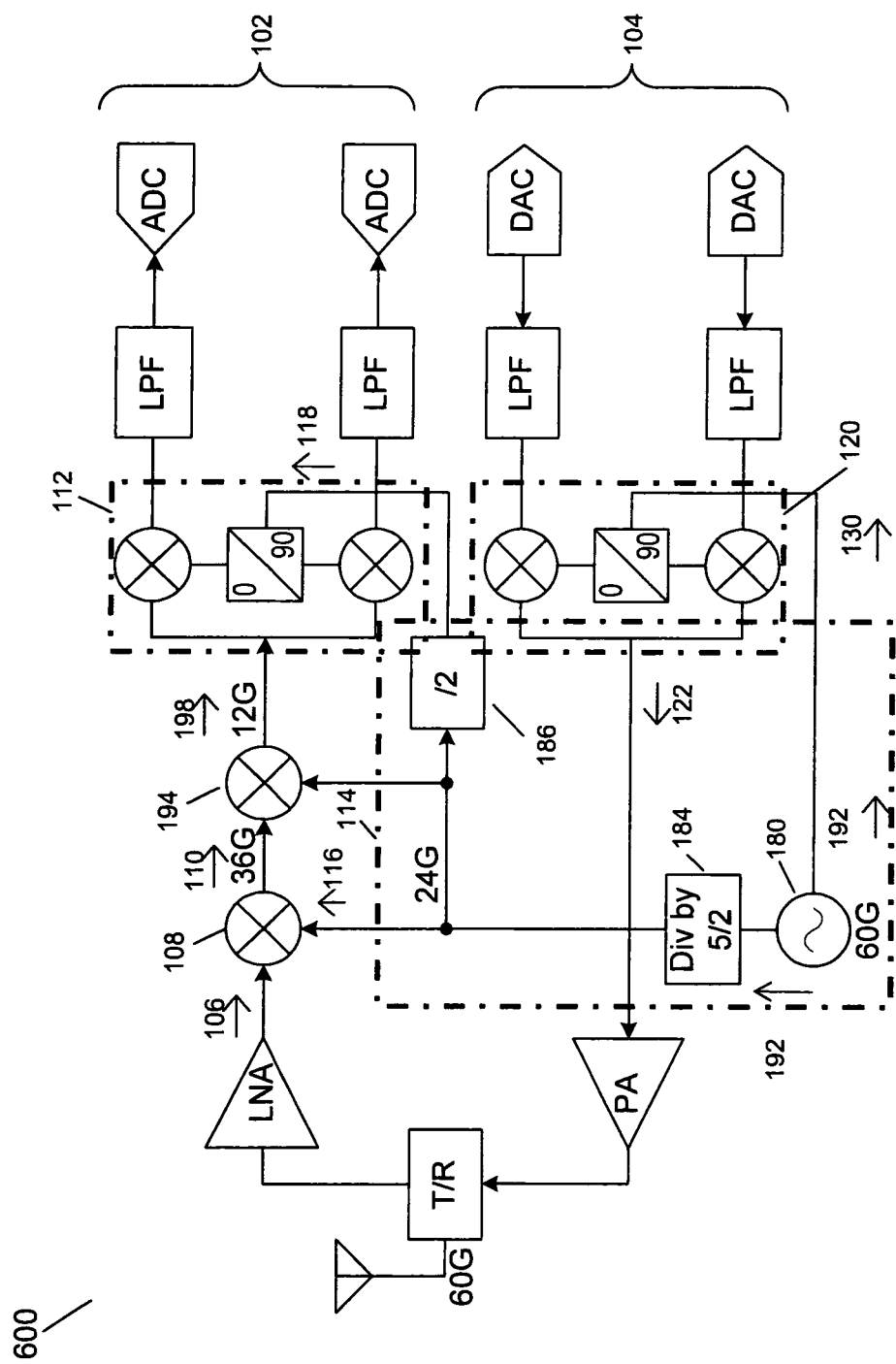
FIG. 6 shows a schematic diagram of a front-end transceiver including a receiver path having a first receiver frequency converter, a second receiver frequency converter and an oscillator signal generator coupled to the first receiver frequency converter and the second receiver frequency converter, the oscillator signal generator having an oscillator, a second compensating circuit and a third compensating circuit according to an embodiment.

FIG. 6 shows a schematic diagram of a front-end transceiver 600 including a receiver path 102 having a first receiver frequency converter 108, a second receiver frequency converter 194 and an oscillator signal generator 114 coupled to the first receiver frequency converter 108 and the second receiver frequency converter 194, the oscillator signal generator 114 having an oscillator 180, a second compensating circuit 184 and a third compensating circuit 186 according to an embodiment.

The front-end transceiver 600 as shown in FIG. 6 may be similar to the front-end transceiver 500 as shown in FIG. 5 with the difference in that the front-end transceiver 600 in FIG. 6 may include the second receiver frequency converter 194. Further, the values of the second compensating circuit 184 and third compensating circuit 186 may be different in FIG. 6 as compared to that in FIG. 5.

In more details, FIG. 6 shows the receiver path 102 including the first receiver frequency converter 108 configured to convert a received signal 106 with a receiver frequency (i.e. 60 GHz) into a first receiver intermediate signal 110 with a first receiver intermediate frequency (i.e. 36 GHz); and a receiver direct conversion stage 112 coupled to the first receiver frequency converter 108 so as to receive the first receiver intermediate signal 110. The front-end transceiver 600 may further include an oscillator signal generator 114 respectively coupled to the first receiver frequency converter 108 and to the receiver direct conversion stage 112 so as to provide a first oscillator signal 116 with a first oscillator frequency (i.e. 24 GHz) to the first receiver frequency converter 108 and a first stabilizing signal 118 with a first stabilizing frequency (i.e. 12 GHz) to the receiver direct conversion stage 112; wherein the oscillator 180 signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

The first receiver frequency converter 108 may be configured so that the first receiver intermediate frequency of the first receiver intermediate signal 110 may include a value of about 36 GHz (i.e. 60 GHz–24 GHz) which may be determined based on a deviation between the receiver frequency (i.e. 60 GHz) of the received signal 106 and the first oscillator frequency of the first oscillator signal 116 (i.e. 24 GHz).

The receiver path 102 may further include a second receiver frequency converter 194, the second receiver frequency converter 194 may be coupled between the first receiver frequency converter 108 and the receiver direct conversion stage 112 so as to receive the first receiver intermediate signal 110 with the first receiver intermediate frequency and to convert the first receiver intermediate signal 110 with the first receiver intermediate frequency into a second receiver intermediate signal 198 with a second receiver intermediate frequency (i.e 12 GHz) to be provided to the receiver direct conversion stage 112.

The oscillator signal generator 114 may be further coupled to the second receiver frequency converter 194 so as to provide the first oscillator signal 116 with the first oscillator 180 frequency to the second receiver frequency converter 194.

The oscillator signal generator 114 may be configured so that the first stabilizing frequency of the first stabilizing signal 118 may be substantially the same as the second receiver intermediate frequency of the second receiver intermediate signal 198.

The second receiver frequency converter 194 may be configured so that the second receiver intermediate frequency of the second receiver intermediate signal 198 may include a value of about 12 GHz about (i.e. 36 GHz–24 GHz) which may be determined based on a deviation between the first receiver intermediate frequency of the first receiver intermediate signal 110 and the first oscillator frequency of the first oscillator signal 116.

The front-end transceiver 600 may further include a transmitter path 104, including a transmitter direct conversion stage 120 configured to provide a transmitter signal 122 to be transmitted with a transmitter frequency (i.e. 60 GHz).

The oscillator signal generator 114 may be coupled to the transmitter direct conversion stage 120 so as to provide a second stabilizing signal 130 with a second stabilizing frequency (i.e. 60 GHz) to the transmitter direct conversion stage 120.

The oscillator signal generator 114 may include the oscillator 180 configured to generate an initial oscillator signal 192 with an initial oscillator frequency (i.e. 60 GHz). The oscillator signal generator 114 may further include a second compensating circuit 184 (i.e. 5/2 divider) coupled to the oscillator 180 so as to receive the initial oscillator signal 192 with an initial oscillator frequency and to convert the initial oscillator signal 192 with the initial oscillator frequency to the first oscillator signal 116 with the first oscillator frequency (i.e. 60 GHz divided by (5/2)=>24 GHz).

The oscillator 180 may be directly coupled to the transmitter direct conversion stage 120 such that the initial oscillator signal 192 with the initial oscillator frequency may be substantially the same as the second stabilizing signal 130 with the second stabilizing frequency. The oscillator signal generator 114 may further include a third compensating circuit 186 (i.e. /2 divider) coupled to the second compensating circuit 184 so as to receive the first oscillator signal 116 with the first oscillator frequency and to convert the first oscillator signal 116 with the first oscillator frequency to the first stabilizing signal 118 with the first stabilizing frequency (i.e. 24 GHz divided by (2)=>12 GHz).

Figure 7:
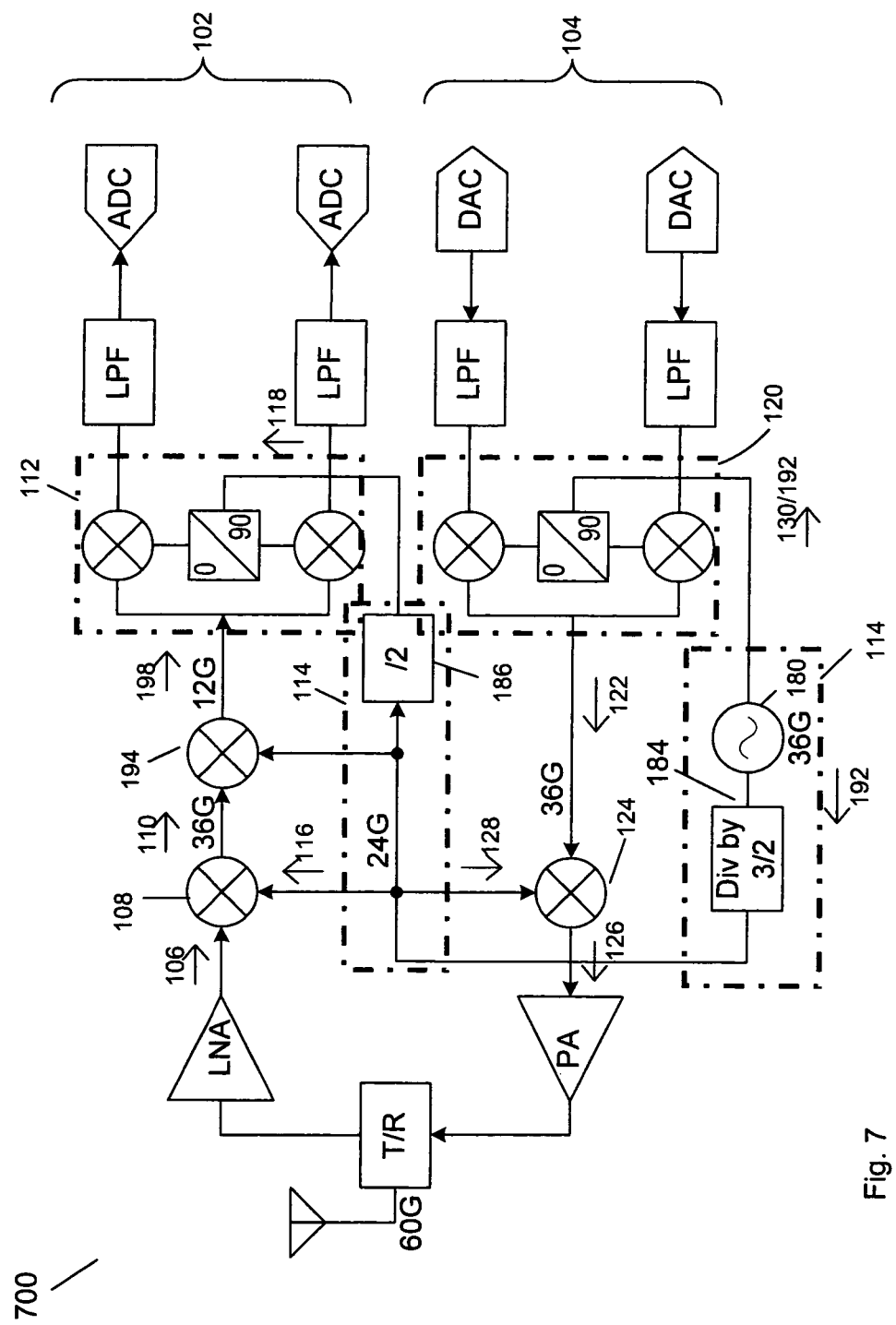
FIG. 7 shows a schematic diagram of a front-end transceiver including a receiver path having a first receiver frequency converter, a second receiver frequency converter, a transmitter path having a first transmitter frequency converter and an oscillator signal generator coupled to the first receiver frequency converter, the second receiver frequency converter and the first transmitter frequency converter, the oscillator signal generator having an oscillator, a second compensating circuit and a third compensating circuit according to an embodiment.

FIG. 7 shows a schematic diagram of a front-end transceiver 700 including a receiver path 102 having a first receiver frequency converter 108, a second receiver frequency converter 194, a transmitter path 104 having a first transmitter frequency converter 124 and an oscillator signal generator 114 coupled to the first receiver frequency converter 108, the second receiver frequency converter 194 and the first transmitter frequency converter 124, the oscillator signal generator 114 having an oscillator 180, a second compensating circuit 184 and a third compensating circuit 186 according to an embodiment.

The front-end transceiver 700 as shown in FIG. 7 may be similar to the front-end transceiver 600 as shown in FIG. 6 with the difference in that the front-end transceiver 700 in FIG. 7 may include the first transmitter frequency converter 124 while the front-end transceiver 600 in FIG. 6 may not. Further, in FIG. 7 the oscillator 180 may include a value of about 36 GHz and the second compensating circuit 184 may include a 3/2 divider while in FIG. 6, the oscillator 180 may include a value of about 60 GHz and the second compensating circuit 184 may include a 5/2 divider.

Along the receiver path 102, the oscillator signal generator 114 may include any suitable combinations of the respective oscillator 180, the second compensating circuit 184 and the third compensating circuit 186 as long as the first oscillator signal 116 may be selected such that any integer multiple of the first oscillator frequency of the first oscillator signal 116 (and any integer multiple of the first receiver intermediate frequency of the first receiver intermediate signal 110) may be different from any integer multiple of the receiver frequency of the received signal 106. Further, the second receiver intermediate frequency of the second receiver intermediate signal 198 may be substantially the same as the first stabilizing signal 118 with the first stabilizing frequency. Similarly, along the transmitter path 104, the oscillator signal generator 114 may include any suitable combinations of the respective oscillator 180, the second compensating circuit 184 and the third compensating circuit 186 as long as the second oscillator signal 128 may be selected such that any integer multiple of the second oscillator frequency of the second oscillator signal 128 (and any integer multiple of the transmitter frequency of the transmitter signal 122 to be transmitted) may be different from any integer multiple of the first transmitter intermediate frequency of the first transmitter intermediate signal 126. Further, the transmitter frequency of the transmitter signal 122 to be transmitted may be substantially the same as the second stabilizing signal 130 with the second stabilizing frequency.

In more details, FIG. 7 shows the receiver path 102 including the first receiver frequency converter 108 configured to convert a received signal 106 with a receiver frequency (i.e. about 60 GHz) into a first receiver intermediate signal 110 with a first receiver intermediate frequency (i.e. about 36 GHz); and a receiver direct conversion stage 112 coupled to the first receiver frequency converter 108 so as to receive the first receiver intermediate signal 110. The front-end transceiver 700 may further include the oscillator signal generator 114 respectively coupled to the first receiver frequency converter 108 and to the receiver direct conversion stage 112 so as to provide a first oscillator signal 116 with a first oscillator frequency (i.e. about 24 GHz) to the first receiver frequency converter 108 and a first stabilizing signal 118 with a first stabilizing frequency (i.e. about 12 GHz) to the receiver direct conversion stage 112; wherein the oscillator signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

The first receiver frequency converter 108 may be configured so that the first receiver intermediate frequency of the first receiver intermediate signal 110 may include a value of about 36 GHz (i.e. 60 GHz–24 GHz) which may be determined based on a deviation between the receiver frequency (i.e. about 60 GHz) of the received signal 106 and the first oscillator frequency (i.e. about 24 GHz) of the first oscillator signal 116.

The receiver path 102 may further include a second receiver frequency converter 194, the second receiver frequency converter 194 may be coupled between the first receiver frequency converter 108 and the receiver direct conversion stage 112 so as to receive the first receiver intermediate signal 110 with the first receiver intermediate frequency and to convert the first receiver intermediate signal 110 with the first receiver intermediate frequency into a second receiver intermediate signal 198 with a second receiver intermediate frequency (i.e. about 12 GHz) to be provided to the receiver direct conversion stage 112.

The oscillator signal generator 114 may be further coupled to the second receiver frequency converter 194 so as to provide the first oscillator signal 116 with the first oscillator frequency to the second receiver frequency converter 194.

The oscillator signal generator 114 may be configured so that the first stabilizing frequency of the first stabilizing signal 118 may be substantially the same as the second receiver intermediate frequency of the second receiver intermediate signal 198.

The second receiver frequency converter 194 may be configured so that the second receiver intermediate frequency of the second receiver intermediate signal 198 may include a value of which may be determined based on a deviation between the first receiver intermediate frequency of the first receiver intermediate signal 110 and the first oscillator frequency of the first oscillator signal 116.

The front-end transceiver 700 may further include a transmitter path 104, including a transmitter direct conversion stage 120 configured to provide a transmitter signal 122 to be transmitted with a transmitter frequency.

The transmitter path 104 may further include a first transmitter frequency converter 124 coupled to the transmitter direct conversion stage 120 so as to receive the transmitter signal 122 to be transmitted with the transmitter frequency (i.e. about 36 GHz) and to convert the transmitter signal 122 to be transmitted with the transmitter frequency into a first transmitter intermediate signal 126 with a first transmitter intermediate frequency (i.e. about 60 GHz).

The oscillator signal generator 114 may be coupled to the first transmitter frequency converter 124 so as to provide a second oscillator signal 128 with a second oscillating frequency (i.e. about 24 GHz) to the first transmitter frequency converter 124.

The oscillator signal generator 114 may be coupled to the transmitter direct conversion stage 120 so as to provide a second stabilizing signal 130 with a second stabilizing frequency (i.e. about 36 GHz) to the transmitter direct conversion stage 120.

The first transmitter frequency converter 124 may be configured so that the first transmitter intermediate frequency of the first transmitter intermediate signal 126 may include a value of which may be determined based on an addition of the transmitter frequency of the transmitter signal 122 to be transmitted and the second oscillator frequency of the second oscillator signal 128.

The oscillator signal generator 114 may include an oscillator 180 configured to generate an initial oscillator signal 192 with an initial oscillator frequency (i.e. about 36 GHz).

The oscillator signal generator 114 may further include a second compensating circuit 184 (i.e. 3/2 divider) coupled to the oscillator 180 so as to receive the initial oscillator signal 192 with an initial oscillator frequency and to convert the initial oscillator signal 192 with the initial oscillator frequency to the first oscillator signal 116 with the first oscillator frequency.

The second compensating circuit 184 may be further configured to convert the initial oscillator signal 192 with the initial oscillator frequency to the second oscillator signal 128 with the second oscillator frequency. The second compensating circuit 184 may be respectively coupled to the first receiver frequency converter 108, the second receiver frequency converter 194 and the first transmitter frequency converter 124.

The oscillator 180 may be coupled to the transmitter direct conversion stage 120 such that the initial oscillator signal 192 with the initial oscillator frequency may be substantially the same as the second stabilizing signal 130 with the second stabilizing frequency.

The oscillator signal generator 114 may further include a third compensating circuit 186 (i.e. /2 divider) coupled to the second compensating circuit 184 so as to receive the first oscillator signal 116 with the first oscillator frequency and to convert the first oscillator signal 116 with the first oscillator frequency to the first stabilizing signal 118 with the first stabilizing frequency.

Figure 8:
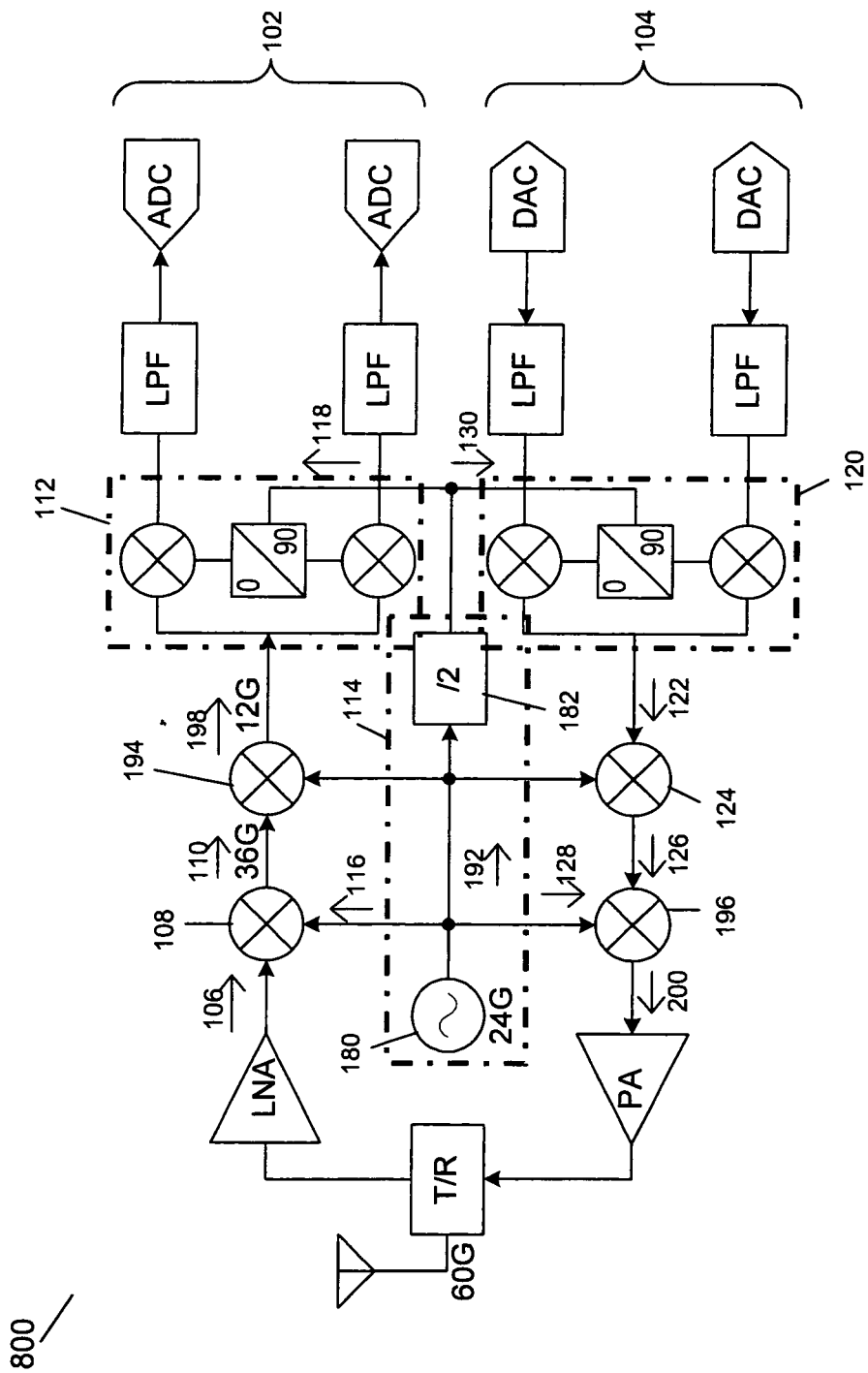
FIG. 8 shows a schematic diagram of a front-end transceiver including a receiver path having a first receiver frequency converter, a second receiver frequency converter, a transmitter path having a first transmitter frequency converter, a second transmitter frequency converter and an oscillator signal generator coupled to the first receiver frequency converter, the second receiver frequency converter, the first transmitter frequency converter and the second transmitter frequency converter, the oscillator signal generator having an oscillator and a first compensating circuit according to an embodiment.

FIG. 8 shows a schematic diagram of a front-end transceiver 800 including a receiver path 102 having a first receiver frequency converter 108, a second receiver frequency converter 194, a transmitter path 104 having a first transmitter frequency converter 124, a second transmitter frequency converter 196 and an oscillator signal generator 114 coupled to the first receiver frequency converter 108, the second receiver frequency converter 194, the first transmitter frequency converter 124 and the second transmitter frequency converter 196, the oscillator signal generator 114 having an oscillator 180 and a first compensating circuit 182 according to an embodiment.

The front-end transceiver 800 as shown in FIG. 8 may be similar to the front-end transceiver 300 as shown in FIG. 3 with the difference in that the front-end transceiver 800 in FIG. 8 may include a second receiver frequency converter 194 and a second transmitter frequency converter 196. Further, in FIG. 8, the oscillator 180 may include a value of about 24

GHz, the first compensating circuit 182 may include a /2 divider and the first receiver intermediate frequency may include a value of 36 GHz while in FIG. 3, the oscillator 180 may include a value of about 36 GHz, the first compensating circuit 182 may include a 3/2 divider and the first receiver intermediate frequency may include a value of 24 GHz. Any suitable combinations of the values of the oscillator 180 and first compensating circuit 182 may be used as long as the first oscillator signal 116 may be selected such that any integer multiple of the first oscillator 180 frequency of the first oscillator signal 116 (and thereby any integer multiple of the first receiver intermediate frequency of the first receiver intermediate signal 110) may be different from any integer multiple of the receiver frequency of the received signal 106. Further, the first stabilizing frequency of the first stabilizing signal 118 may be substantially the same as the second receiver intermediate frequency of the second receiver intermediate signal 198. Also, any suitable combinations of the values of the oscillator 180 and the first compensating circuit 182 may be used as long as the second oscillator signal 128 may be selected such that any integer multiple of the second oscillator frequency of the second oscillator signal 128 (and thereby any integer multiple of the first transmitter intermediate frequency of the first transmitter intermediate signal 126) may be different from any integer multiple of the second transmitter intermediate frequency of the second transmitter intermediate signal 200. Further, the first stabilizing frequency of the first stabilizing signal 118 may be substantially the same as the first receiver intermediate frequency of the first receiver intermediate signal 110 and the second stabilizing frequency of the second stabilizing signal 130 may be substantially the same as the transmitter frequency of the transmitter signal 122 to be transmitted.

In more details, FIG. 8 shows the receiver path 102 including the first receiver frequency converter 108 configured to convert a received signal 106 with a receiver frequency (i.e. about 60 GHz) into a first receiver intermediate signal 110 with a first receiver intermediate frequency (i.e about 36 GHz); and a receiver direct conversion stage 112 coupled to the first receiver frequency converter 108 so as to receive the first receiver intermediate signal 110. The front-end transceiver 800 may further include the oscillator signal generator 114 respectively coupled to the first receiver frequency converter 108 and to the receiver direct conversion stage 112 so as to provide a first oscillator signal 116 with a first oscillator frequency (i.e. about 24 GHz) to the first receiver frequency converter 108 and a first stabilizing signal 118 with a first stabilizing frequency (i.e. about 12 GHz) to the receiver direct conversion stage 112; wherein the oscillator signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

The first receiver frequency converter 108 may be configured so that the first receiver intermediate frequency of the first receiver intermediate signal 110 may include a value of about 36 GHz (i.e. 60 GHz–24 GHz) which may be determined based on a deviation between the receiver frequency (i.e. about 60 GHz) of the received signal 106 and the first oscillator 180 frequency (i.e. about 24 GHz) of the first oscillator signal 116.

The receiver path 102 may further include a second receiver frequency converter 194, the second receiver frequency converter 194 may be coupled between the first receiver frequency converter 108 and the receiver direct conversion stage 112 so as to receive the first receiver intermediate signal 110 with the first receiver intermediate frequency and to convert the first receiver intermediate signal 110 with the first receiver intermediate frequency into a second receiver intermediate signal 198 with a second receiver intermediate frequency (i.e. about 12 GHz) to be provided to the receiver direct conversion stage 112.

The oscillator signal generator 114 may be further coupled to the second receiver frequency converter 194 so as to provide the first oscillator signal 116 with the first oscillator 180 frequency to the second receiver frequency converter 194.

The oscillator signal generator 114 may be configured so that the first stabilizing frequency of the first stabilizing signal 118 may be substantially the same as the second receiver intermediate frequency of the second receiver intermediate signal 198.

The second receiver frequency converter 194 may be configured so that the second receiver intermediate frequency of the second receiver intermediate signal 198 may include a value of which may be determined based on a deviation between the first receiver intermediate frequency of the first receiver intermediate signal 110 and the first oscillator frequency of the first oscillator signal 116.

The front-end transceiver 800 may further include the transmitter path 104, including a transmitter direct conversion stage 120 configured to provide a transmitter signal 122 to be transmitted with a transmitter frequency.

The transmitter path 104 may further include a first transmitter frequency converter 124 coupled to the transmitter direct conversion stage 120 so as to receive the transmitter signal 122 to be transmitted with the transmitter frequency (i.e. about 12 GHz) and to convert the transmitter signal 122 to be transmitted with the transmitter frequency into a first transmitter intermediate signal 126 with a first transmitter intermediate frequency (i.e. about 36 GHz) and a second transmitter frequency converter 196 coupled to the first transmitter frequency converter 124 so as to receive the first transmitter intermediate signal with the first transmitter intermediate frequency and to convert the first transmitter intermediate signal 126 with the first transmitter intermediate frequency into a second transmitter intermediate signal 200 with a second transmitter intermediate frequency (i.e. 60 GHz).

The oscillator signal generator 114 may be respectively coupled to the first transmitter frequency converter 124 and the second transmitter frequency converter 196 so as to provide a second oscillator signal 128 with a second oscillating frequency (i.e. 24 GHz) to the first transmitter frequency converter 124 and the second transmitter frequency converter 196.

The oscillator signal generator 114 may be coupled to the transmitter direct conversion stage 120 so as to provide a second stabilizing signal 130 with a second stabilizing frequency (i.e. 12 GHz) to the transmitter direct conversion stage 120.

The oscillator signal generator 114 may be configured so that the second oscillator 180 frequency of the second oscillator signal 128 may be selected such that any integer multiple of the second oscillator frequency of the second oscillator signal 128 may be different from any integer multiple of the second transmitter intermediate frequency of the second transmitter intermediate signal 200.

The first transmitter frequency converter 124 may be configured so that the first transmitter intermediate frequency of the first transmitter intermediate signal may include a value of which may be determined based on an addition of the transmitter frequency of the transmitter signal 122 to be transmitted and the second oscillator frequency of the second oscillator 180 signal 128.

The second transmitter frequency converter 196 may be configured so that the second transmitter intermediate frequency of the second transmitter intermediate signal 200 may include a value of which may be determined based on an addition of the first transmitter intermediate frequency of the first transmitter intermediate signal 126 and the second oscillator frequency of the second oscillator signal 128.

The first transmitter frequency converter 124 may be configured to provide the first transmitter intermediate signal with the first transmitter intermediate frequency of about 36 GHz.

The oscillator signal generator 114 may include an oscillator 180 configured to generate an initial oscillator signal 192 with an initial oscillator frequency. The oscillator signal generator 114 may be configured such that the first oscillator signal 116 with the first oscillator 180 frequency may be substantially the same as the initial oscillator signal 192 with the initial oscillator frequency. The oscillator signal generator 114 may be configured such that the second oscillator signal 128 with the second oscillator frequency may be substantially the same as the initial oscillator signal 192 with the initial oscillator frequency.

The oscillator signal generator 114 may further include a first compensating circuit 182 coupled to the oscillator 180 so as to receive the initial oscillator signal 192 with the initial oscillator frequency and to convert the initial oscillator signal 192 with the initial oscillator frequency to the first stabilizing signal 118 with the first stabilizing frequency. The first compensating circuit 182 may be further configured to convert the initial oscillator signal 192 with the initial oscillator frequency to the second stabilizing signal 130 with the second stabilizing frequency. The first stabilizing signal 118 with the first stabilizing frequency may be the same as the second stabilizing signal 130 with the second stabilizing frequency.

Figure 9:
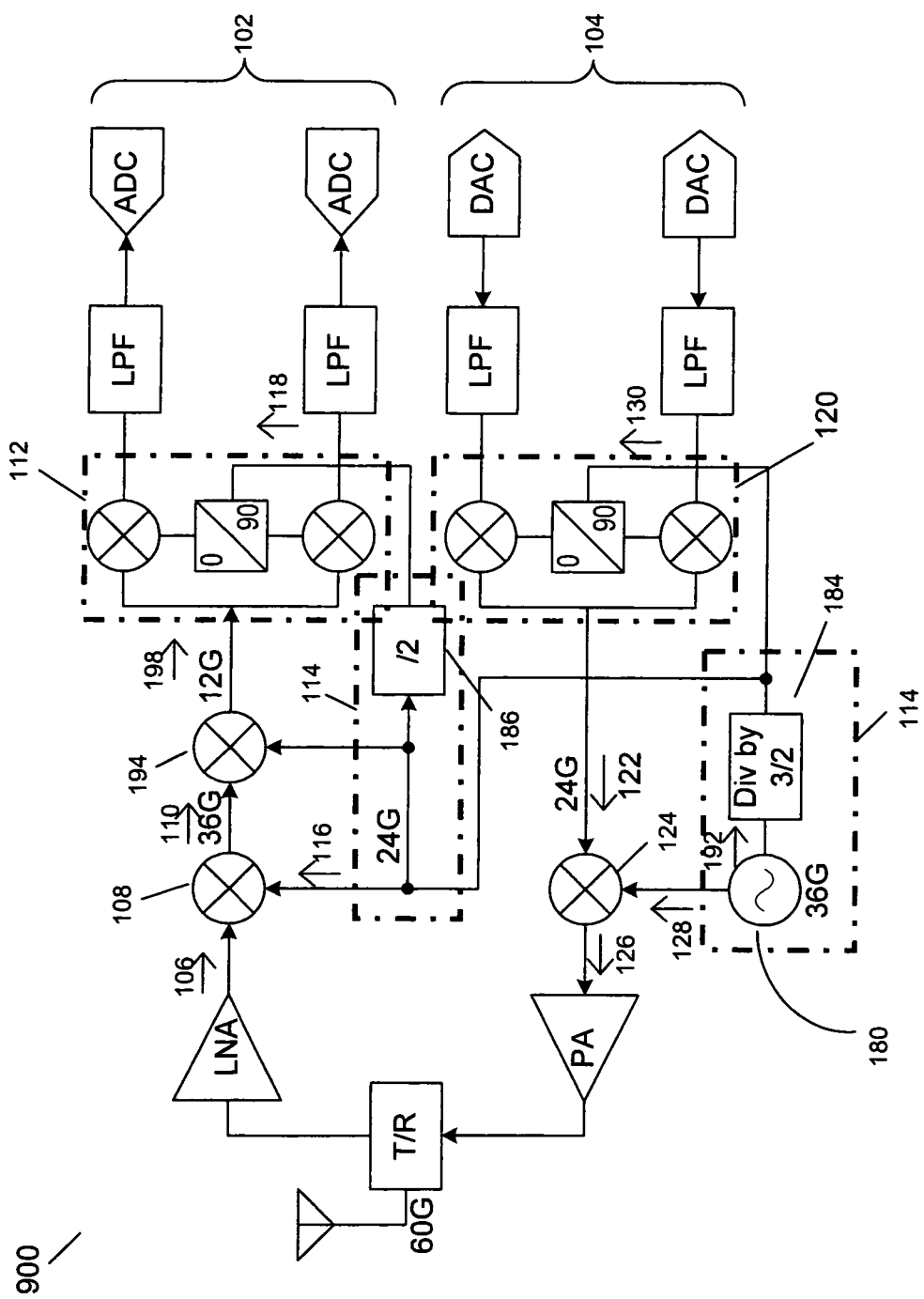
FIG. 9 shows a schematic diagram of a front-end transceiver including a receiver path having a first receiver frequency converter, a second receiver frequency converter, a transmitter path having a first transmitter frequency converter and an oscillator signal generator coupled to the first receiver frequency converter, the second receiver frequency converter and the first transmitter frequency converter, the oscillator signal generator having an oscillator, a second compensating circuit and a third compensating circuit according to an embodiment.

FIG. 9 shows a schematic diagram of a front-end transceiver 900 including a receiver path 102 having a first receiver frequency converter 108, a second receiver frequency converter 194, a transmitter path 104 having a first transmitter frequency converter 124 and an oscillator signal generator 114 coupled to the first receiver frequency converter 108, the second receiver frequency converter 194 and the first transmitter frequency converter 124, the oscillator signal generator 114 having an oscillator 180, a second compensating circuit 184 and a third compensating circuit 186 according to an embodiment.

The front-end transceiver 900 as shown in FIG. 9 may be similar to the front-end transceiver 700 as shown in FIG. 7 with the difference in the positioning of the oscillator 180 and the second compensating circuit 184 relative to the first transmitter frequency converter 124 and the transmitter direct conversion stage 120.

In more details, FIG. 9 shows the receiver path 102 including the first receiver frequency converter 108 configured to convert a received signal 106 with a receiver frequency (i.e. about 60 GHz) into a first receiver intermediate signal 110 with a first receiver intermediate frequency (i.e. about 36 GHz); and a receiver direct conversion stage 112 coupled to the first receiver frequency converter 108 so as to receive the first receiver intermediate signal 110. The front-end transceiver 900 may further include the oscillator signal generator 114 respectively coupled to the first receiver frequency converter 108 and to the receiver direct conversion stage 112 so as to provide a first oscillator signal 116 with a first oscillator frequency (i.e. about 24 GHz) to the first receiver frequency converter 108 and a first stabilizing signal 118 with a first stabilizing frequency to the receiver direct conversion stage 112; wherein the oscillator signal generator 114 may be configured so that the first oscillator frequency of the first oscillator signal 116 may be selected such that any integer multiple of the first oscillator frequency of the first oscillator signal 116 may be different from any integer multiple of the receiver frequency of the received signal 106.

The first receiver frequency converter 108 may be configured so that the first receiver intermediate frequency of the first receiver intermediate signal 110 may include a value of which may be determined based on a deviation between the receiver frequency of the received signal 106 and the first oscillator frequency of the first oscillator signal 116.

The receiver path 102 may further include a second receiver frequency converter 194, the second receiver frequency converter 194 may be coupled between the first receiver frequency converter 108 and the receiver direct conversion stage 112 so as to receive the first receiver intermediate signal 110 with the first receiver intermediate frequency and to convert the first receiver intermediate signal 110 with the first receiver intermediate frequency into a second receiver intermediate signal 198 with a second receiver intermediate frequency (i.e. about 12 GHz) to be provided to the receiver direct conversion stage 112.

The oscillator signal generator 114 may be further coupled to the second receiver frequency converter 194 so as to provide the first oscillator signal 116 with the first oscillator frequency to the second receiver frequency converter 194.

The oscillator signal generator 114 may be configured so that the first stabilizing frequency of the first stabilizing signal 118 may be substantially the same as the second receiver intermediate frequency of the second receiver intermediate signal 198.

The second receiver frequency converter 194 may be configured so that the second receiver intermediate frequency of the second receiver intermediate signal 198 may include a value of which may be determined based on a deviation between the first receiver intermediate frequency of the first receiver intermediate signal 110 and the first oscillator frequency of the first oscillator signal 116.

The front-end transceiver 900 may further include a transmitter path 104, including a transmitter direct conversion stage 120 configured to provide a transmitter signal 122 to be transmitted with a transmitter frequency.

The transmitter path 104 may further include a first transmitter frequency converter 124 coupled to the transmitter direct conversion stage 120 so as to receive the transmitter signal 122 to be transmitted with the transmitter frequency (i.e. about 24 GHz) and to convert the transmitter signal 122 to be transmitted with the transmitter frequency into a first transmitter intermediate signal 126 with a first transmitter intermediate frequency (i.e. about 60 GHz).

The oscillator signal generator 114 may be coupled to the first transmitter frequency converter 124 so as to provide a second oscillator signal 128 with a second oscillating frequency (i.e. about 36 GHz) to the first transmitter frequency converter 124. The second oscillating frequency may be different from the first oscillating frequency.

The oscillator signal generator 114 may be coupled to the transmitter direct conversion stage 120 so as to provide a second stabilizing signal 130 with a second stabilizing frequency (i.e. about 24 GHz) to the transmitter direct conversion stage 120.

The oscillator signal generator 114 may include an oscillator 180 configured to generate an initial oscillator signal 192 with an initial oscillator frequency (i.e. about 36 GHz).

The oscillator signal generator 114 may further include a second compensating circuit 184 (i.e. 3/2 divider) coupled to the oscillator 180 so as to receive the initial oscillator signal 192 with the initial oscillator frequency and to convert the initial oscillator signal 192 with the initial oscillator frequency to the first oscillator signal 116 with the first oscillator frequency.

The oscillator signal generator 114 may further include a third compensating circuit 186 (i.e /2 divider) coupled to the second compensating circuit 184 so as to receive the first oscillator signal 116 with the first oscillator frequency and to convert the first oscillator signal 116 with the first oscillator frequency to the first stabilizing signal 118 with the first stabilizing frequency.

The oscillator 180 may be coupled to the first transmitter frequency converter 124 such that the initial oscillator signal 192 with the initial oscillator frequency may be substantially the same as the second oscillator signal 128 with the second oscillator frequency.

The second compensating circuit 184 may be coupled to the transmitter direct conversion stage 120 such that the first oscillator signal 116 with the first oscillator 180 frequency may be substantially the same as the second stabilizing signal 130 with the second stabilizing frequency.

Figure 10:
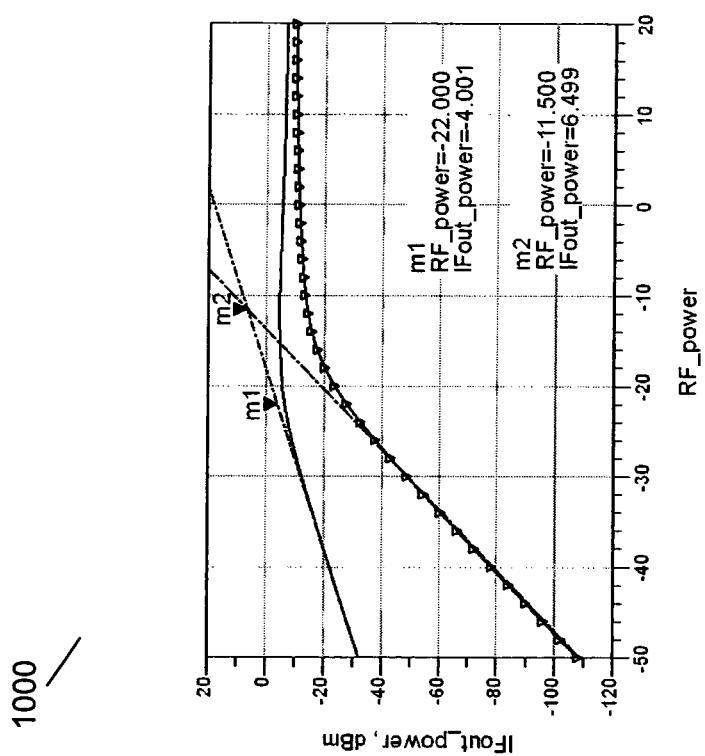
FIG. 10 shows a plot of measured receiver characteristics indicating $P_{1dB}$ (m1) and $P_{IIP3}$ (m2) output of a front-end transceiver according to an embodiment.

FIG. 10 shows a plot 1000 of measured receiver characteristics indicating $P_{1dB}$ (m1) and $P_{IIP3}$ (m2) output of a front-end transceiver 100, 200, 300, 400, 500, 600, 700, 800, 900 as shown in FIGS. 1, 2, 3, 4, 5, 6, 7, 8 and 9 according to an embodiment.

For a study of the characteristics of the front-end transceiver architecture, the receiver may include a RF heterodyne mixing stage and an IF quadrature direct conversion mixing stage. Similar topology may be used for transmitter measurements. The 60-GHz transceiver 100, 200, 300, 400, 500, 600, 700, 800, 900 as shown in FIGS. 1, 2, 3, 4, 5, 6, 7, 8 and 9 may be governed by the IEEE standard 802.15.3c, IEEE standard 802.11ad, etc. specifying that the applications may include 4 channels, with each channel of about 2.16 GHz bandwidth. The RF frequency range of the transmitter path 104 may be about 60 GHz to about 62.16 GHz and the receiver baseband frequency range may be 0 to about 2.16 GHz. The simulation may be performed at the system level for the transceiver architectures using Agilent Advanced Design System 2008 version EDA tool for example.

The receiver may be measured for the following parameters such as conversion gain, third order intercept point, image rejection, half IF rejection, 1 dB gain compression point, nearby interferers rejection, noise figure and DC offset due to self-mixing. The setup may have behavioral system blocks configured for the specifications such as RF input power=−30 dBm with single tone of 62.16 GHz frequency (corresponding to the maximum input RF band), LNA gain=20 dB and NF=4.5 dB, the image-reject band pass filter with $f_{center}$=60 GHz and bandwidth 15 GHz. The channel selection low pass filter may be selected for $f_H$=2.4 GHz. The receiver's dynamic range of the proposed architecture may be determined by calculating the input sensitivity using, $$P_{in\text{-}min}=10 \log(kTB)+NF=-174 \text{ dBm/Hz}+10 \log(2.16 \text{ GHz/Hz})+4.74=-75.9 \text{ dBm} \quad (1)$$

and the maximum input level, from the FIG. 10, as, $$P_{in\text{-}max}=P1 \text{ dB}=-22 \text{ dBm} \quad (2)$$

Hence the dynamic range (DR), $$DR=P_{in\text{-}max}-P_{in\text{-}min}=53.9 \text{ dBm} \quad (3)$$

Similarly, the transmitter path 104 may be measured for image attenuation, RF output power, conversion gain, output referred-1 dB gain compression point and carrier suppression. The baseband power input used may be about −30 dBm with a single tone frequency of about 2.16 GHz and a power amplifier 154 (PA) configured for gain of about 20 dB. The image rejection filter and the baseband low pass filter may be similar to the receiver path 102.

The power consumption of the transceiver 100, 200, 300, 400, 500, 600, 700, 800, 900 as shown in FIGS. 1, 2, 3, 4, 5, 6, 7, 8 and 9 including both the transmitter path 104 and receiver path 102 may be measured by replacing active circuit blocks such as the Gilbert mixer with their respective circuit models from the Agilent ADS library for example.

In this regard, the proposed 36G/24G architecture when used as the receiver path 102 may have enhanced performance characteristics both for sensitivity with $P_{1dB}$=−22 dBm, $P_{IIP3}$=−11.5 dBm, conversion gain=17.58 dB, noise figure=4.74 dB and selectivity with image rejection=131.9 dB, DC offset=−40.5 dBm, half IF image rejection=334.4 dB and nearby interferer rejection=24.52 dB. For the transmitter path 104, using the 36G/24G architecture may have comparable performance for most of the parameters. In addition, the unwanted emissions may have a smaller magnitude of −131 dBm and a carrier suppression of 24.28 dB. The architecture may help to develop a low cost, portable (low power consumption=98.82 mW), compact transceiver architecture. By reusing the already existing mature 24G transceiver IP, the development and validation cost of the 60 GHz architecture may be greatly simplified.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A front-end transceiver, comprising:
   a receiver path, comprising:
      a first receiver frequency converter configured to convert a received signal with a receiver frequency into a first receiver intermediate signal with a first receiver intermediate frequency;
      a receiver direct conversion stage coupled to the first receiver frequency converter so as to receive the first receiver intermediate signal; and
      an oscillator signal generator respectively coupled to the first receiver frequency converter and to the receiver direct conversion stage so as to provide a first oscillator signal with a first oscillator frequency to the first receiver frequency converter and a first stabilizing signal with a first stabilizing frequency to the receiver direct conversion stage;
      wherein the first receiver frequency converter is configured so that the first receiver intermediate frequency of the first receiver intermediate signal comprises a value of which is determined based on a deviation between the receiver frequency of the received signal and the first oscillator frequency of the first oscillator signal;
      wherein the oscillator signal generator is configured to provide the first oscillator signal with the first oscillator frequency of 24 GHz or 36 GHz; and wherein the receiver frequency of the received signal is 60 GHz.

2. The front-end transceiver of claim 1, wherein the oscillator signal generator is configured so that the first stabilizing frequency of the first stabilizing signal is substantially the same as the first receiver intermediate frequency of the first receiver intermediate signal.

3. The front-end transceiver of claim 1, wherein the receiver path further comprises a second receiver frequency converter, the second receiver frequency converter is coupled between the first receiver frequency converter and the receiver direct conversion stage so as to receive the first receiver intermediate signal with the first receiver intermediate frequency and to convert the first receiver intermediate signal with the first receiver intermediate frequency into a second receiver intermediate signal with a second receiver intermediate frequency to be provided to the receiver direct conversion stage.

4. The front-end transceiver of claim 3, wherein the oscillator signal generator is further coupled to the second receiver frequency converter so as to provide the first oscillator signal with the first oscillator frequency to the second receiver frequency converter.

5. The front-end transceiver of claim 4, wherein the second receiver frequency converter is configured so that the second receiver intermediate frequency of the second receiver intermediate signal comprises a value of which is determined based on a deviation between the first receiver intermediate frequency of the first receiver intermediate signal and the first oscillator frequency of the first oscillator signal.

6. The front-end transceiver of claim 3, wherein the oscillator signal generator is configured so that the first stabilizing frequency of the first stabilizing signal is substantially the same as the second receiver intermediate frequency of the second receiver intermediate signal.

7. The front-end transceiver of claim 1, further comprising:
a transmitter path, comprising:
a transmitter direct conversion stage configured to provide a transmitter signal to be transmitted with a transmitter frequency.

8. The front-end transceiver of claim 7, wherein the transmitter path further comprises:
a first transmitter frequency converter coupled to the transmitter direct conversion stage so as to receive the transmitter signal to be transmitted with the transmitter frequency and to convert the transmitter signal to be transmitted with the transmitter frequency into a first transmitter intermediate signal with a first transmitter intermediate frequency.

9. The front-end transceiver of claim 8, wherein the oscillator signal generator is coupled to the first transmitter frequency converter so as to provide a second oscillator signal with a second oscillating frequency to the first transmitter frequency converter.

10. The front-end transceiver of claim 9, wherein the first transmitter frequency converter is configured so that the first transmitter intermediate frequency of the first transmitter intermediate signal comprises a value of which is determined based on an addition of the transmitter frequency of the transmitter signal to be transmitted and the second oscillator frequency of the second oscillator signal.

11. The front-end transceiver of claim 7, wherein the oscillator signal generator is coupled to the transmitter direct conversion stage so as to provide a second stabilizing signal with a second stabilizing frequency to the transmitter direct conversion stage.

12. The front-end transceiver of claim 7, wherein the transmitter path further comprises:
a first transmitter frequency converter coupled to the transmitter direct conversion stage so as to receive the transmitter signal to be transmitted with the transmitter frequency and to convert the transmitter signal to be transmitted with the transmitter frequency into a first transmitter intermediate signal with a first transmitter intermediate frequency; and
a second transmitter frequency converter coupled to the first transmitter frequency converter so as to receive the first transmitter intermediate signal with the first transmitter intermediate frequency and to convert the first transmitter intermediate signal with the first transmitter intermediate frequency into a second transmitter intermediate signal with a second transmitter intermediate frequency.

13. The front-end transceiver of claim 8, wherein the transmitter path further comprises a transmitter antenna coupled to the first transmitter frequency converter and configured to receive the first transmitter intermediate frequency from the first transmitter frequency converter.

14. The front-end transceiver of claim 1, wherein the oscillator signal generator comprises an oscillator configured to generate an initial oscillator signal with an initial oscillator frequency.

15. The front-end transceiver of claim 14, wherein the oscillator signal generator further comprises a first compensating circuit coupled to the oscillator so as to receive the initial oscillator signal with the initial oscillator frequency and to convert the initial oscillator signal with the initial oscillator frequency to the first stabilizing signal with the first stabilizing frequency.

16. The front-end transceiver of claim 14, wherein the oscillator signal generator further comprises a second compensating circuit coupled to the oscillator so as to receive the initial oscillator signal with an initial oscillator frequency and to convert the initial oscillator signal with the initial oscillator frequency to the first oscillator signal with the first oscillator frequency.

17. The front-end transceiver of claim 1, wherein the receiver path further comprises a receiver antenna coupled to the first receiver frequency converter and configured to provide the received signal to the first receiver frequency converter.

18. A front-end transceiver, comprising:
a transmitter path, comprising:
a transmitter direct conversion stage configured to provide a transmitter signal to be transmitted with a transmitter frequency;
a first transmitter frequency converter coupled to the transmitter direct conversion stage so as to receive the transmitter signal to be transmitted with the transmitter frequency and to convert the transmitter signal to be transmitted with the transmitter frequency into a first transmitter intermediate signal with a first transmitter intermediate frequency; and
an oscillator signal generator respectively coupled to the first transmitter frequency converter and to the transmitter direct conversion stage so as to provide a second oscillator signal with a second oscillator frequency to the first transmitter frequency converter and a second stabilizing signal with a second stabilizing frequency to the transmitter direct conversion stage;
wherein the first transmitter frequency converter is configured so that the first transmitter intermediate frequency of the first transmitter intermediate signal comprises a value which is determined based on an addition of the transmitter frequency of the transmitter signal to be transmitted and the second oscillator frequency of the second oscillator signal;

wherein the oscillator signal generator is configured to provide the second oscillator signal with the second oscillator frequency of 24 GHz or 36 GHz; and
wherein the first transmitter intermediate frequency of the first transmitter intermediate signal is 60 GHz.

19. A front-end transceiver, comprising:
a transmitter path, comprising:
a transmitter direct conversion stage configured to provide a transmitter signal to be transmitted with a transmitter frequency;
a first transmitter frequency converter coupled to the transmitter direct conversion stage so as to receive the transmitter signal to be transmitted with the transmitter frequency and to convert the transmitter signal to be transmitted with the transmitter frequency into a first transmitter intermediate signal with a first transmitter intermediate frequency;
a second transmitter frequency converter coupled to the first transmitter frequency converter so as to receive the first transmitter intermediate signal with the first transmitter intermediate frequency and to convert the first transmitter intermediate signal with the first transmitter intermediate frequency into a second transmitter intermediate signal with a second transmitter intermediate frequency; and
an oscillator signal generator respectively coupled to the first transmitter frequency converter, the second transmitter frequency converter and to the transmitter direct conversion stage so as to provide a second oscillator signal with a second oscillator frequency to the first transmitter frequency converter and the second transmitter frequency converter and a second stabilizing signal with a second stabilizing frequency to the transmitter direct conversion stage;
wherein the second transmitter frequency converter is configured so that the second transmitter intermediate frequency of the second transmitter intermediate signal comprises a value which is determined based on an addition of the first transmitter intermediate frequency of the first transmitter intermediate signal and the second oscillator frequency of the second oscillator signal;
wherein the oscillator signal generator is configured to provide the second oscillator signal with the second oscillator frequency of 24 GHz or 36 GHz; and wherein the second transmitter intermediate frequency of the second transmitter intermediate signal is 60 GHz.

* * * * *